United States Patent [19]
Masui et al.

[11] Patent Number: 5,557,116
[45] Date of Patent: Sep. 17, 1996

[54] SEMICONDUCTOR LASER DEVICE AND RESIN LAYER

[75] Inventors: Katsushige Masui; Nobuyuki Miyauchi, both of Nara; Zenpei Tani, Tondabayashi; Hiroshi Chikugawa, Kashihara; Makoto Tsuji, Nara-ken; Masaru Ogawa, Nara; Takehiro Shiomoto, Kashihara, all of Japan

[73] Assignee: Sharp Kabushiki Kaisha, Osaka, Japan

[21] Appl. No.: 178,399

[22] Filed: Dec. 22, 1993

[30] Foreign Application Priority Data

| Dec. 24, 1992 | [JP] | Japan | 4-342979 |
| Apr. 30, 1993 | [JP] | Japan | 5-104801 |
| May 27, 1993 | [JP] | Japan | 5-125751 |
| Jun. 10, 1993 | [JP] | Japan | 5-138318 |

[51] Int. Cl.⁶ ............................ H01L 33/00; H01S 3/18
[52] U.S. Cl. ......................... 257/100; 257/433; 257/690; 372/43; 372/49
[58] Field of Search ........................... 257/81, 99, 100, 257/432, 433, 434, 459, 690, 692, 773, 462; 372/36, 43.49

[56] References Cited

U.S. PATENT DOCUMENTS

| 4,733,067 | 3/1988 | Oinoue et al. | 257/100 |
| 4,768,070 | 8/1988 | Takizawa et al. | 257/99 |
| 4,818,099 | 4/1989 | Preikschat et al. | 257/433 |
| 4,962,985 | 10/1990 | LeGrange | 350/96.15 |
| 5,089,861 | 2/1992 | Tanaka et al. | 257/99 |
| 5,130,531 | 7/1992 | Ito et al. | 257/100 |
| 5,226,052 | 7/1993 | Tanaka et al. | 257/100 |
| 5,355,385 | 10/1994 | Amano et al. | 372/49 |

FOREIGN PATENT DOCUMENTS

| 66-194550 | 10/1985 | Japan | 257/692 |

*Primary Examiner*—Sara W. Crane
*Assistant Examiner*—T. M. Arroyo
*Attorney, Agent, or Firm*—Morrison & Foerster

[57] ABSTRACT

A semiconductor laser device includes a base, a semiconductor laser chip and a resin layer enclosing the laser chip. The base may have a monitor photodiode mounted thereon in the vicinity of the laser chip. The resin layer enclosing the laser chip or both of the laser chip and the monitor diode chip is made of a single synthetic resin having a thickness not greater than 500 μm and also having a surface substantially parallel to an outwardly oriented beam emitting end face of the laser chip.

14 Claims, 20 Drawing Sheets

| Resin Thick.(μm) | Deterioration Time |
|---|---|
| 0.1 | 50 |
| 1 | 100 |
| 3 | 250 |
| 7 | 1000 |
| 10 | Not Deteriorated |
| 20 | Not Deteriorated |
| 30 | Not Deteriorated |

Resin Thickness: 1 μm
Atmosphere: 65°C & 95%

SEMICONDUCTOR LASER DEVICE AND RESIN LAYER

BACKGROUND OF THE INVENTION

1. Field of the Invention

The present invention relates to a laser device which may be employed as a light source in an optical pick-up device, optical transmission, an optical disc system or any other optical measuring system.

2. Description of the Prior Art

Various types of semiconductor laser devices have hitherto been employed. A so-called unit-type such as shown in FIGS. 43 and 44 is also well known in the art. FIGS. 43 and 44 illustrate the prior art unit-type in a center longitudinal sectional view and a perspective view with a protective resin layer removed.

The prior art laser device shown in FIGS. 43 and 44 comprises a substrate 362 made of aluminum and having one surface plated with nickel or gold. The substrate 362 includes a sub-mount 363 fixedly mounted on the plated surface of the substrate by means of a bonding material such as indium, The sub-mount 362 is substantially rectangular in shape and made of silicon, having an outer surface thereof formed with aluminum wiring 365 and 366. The aluminum wiring 365 is used to supply an electric power to a laser diode chip 369 through a silicon dioxide film 364, whereas the aluminum wiring 366 is used to draw from the sub-mount 363 an electric current produced in the sub-mount 63 as a result of operation of a monitor element 367 as will be discussed later.

The aluminum wiring 365 formed on a central region of the sub-mount 363 forms a bonding surface onto which the laser diode chip 369 is bonded by means of a deposit of electroconductive brazing material. The laser diode chip 369 has two laser beam emitting end faces 396a and 369b opposite to each other and is mounted on the sub-mount 363 with the laser beam emitting faces 396a and 396b oriented outwardly and inwardly, respectively. A portion of a central region of the outer surface of the sub-mount 363 which is adjacent to the inwardly oriented laser beam emitting end 369b of the laser diode chip 369 is integrally fabricated with the monitor element 367. This monitor element 367 is comprised of a photo-diode element formed by diffusing P-type impurities from the outer surface of the sub-mount 369 to form a PN junction and is electrically connected with the aluminum wiring 366.

The aluminum wiring 365 and 366 are wire-bonded to respective leads 371a and 371b, formed on a flexible circuit 71 connected with the substrate 362, through wires W1 and W2. The laser diode chip 369 has a negative pole wire-bonded by means of a wire W4 to a pad 368 internally conducted with the sub-mound 363 through an window perforated in the silicon dioxide film 364 so that the negative pole of the laser diode chip 369 is held in electrically connected relationship with the substrate 362.

The substrate 362 is in turn wire-bonded by means of a wire W3 with a lead 371c of the flexible circuit 371.

The laser diode chip 369 is overlaid by a transparent resin 372 which not only covers the outwardly oriented laser beam emitting end face 369a of the laser diode chip 369, but extends inwardly of the laser diode chip 369 so as to form a solid waveguide 472a communicating between the inwardly oriented laser beam emitting end face 369b and the monitor element 367.

The transparent resin 372 is employed in the form of an epoxy rein or a silicone resin which has been deposited on the laser diode chip 369 while it is in a fluid state. The fluid resin which eventually forms the transparent resin 372, when applied to the outwardly oriented laser beam emitting end face 396a, forms a flat surface film by the effect of a surface tension. When this fluid resin so applied is hardened or cured, the flat surface film of the resin is cured while retaining the flat shape so as to forme a flat emission surface when cured.

The assembly including the sub-mount 363, having the laser diode chip 369 and the monitor element 367 bonded thereon, an end portion of the flexible circuit 71 and the wires W1 to S4 is covered by a protective resin layer 373.

It has, however, been found that the prior art laser device shown in FIGS. 43 and 44 has the following problems. In the first place, the thickness of the transparent resin 372 covering the outwardly oriented laser beam emitting end face 396a of the laser diode chip 369 cannot be specifically defined. The greater is the thickness of the transparent resin 372, the more often is the laser emission characteristic disturbed due to a multiplex reflection of light between the outwardly oriented laser beam emitting end face 369a and the surface of the transparent resin 372. Therefore, the prior art laser device cannot be satisfactorily be used as a light source in an optical disc recording and/or reproducing system.

FIG. 45 illustrates the laser emission characteristic exhibited when the thickness of the transparent resin 372 (hereinafter referred to as the resin thickness) covering the outwardly oriented laser beam emitting end face 369a of the laser diode chip 369 is 1,000 µm. As shown in the graph of FIG. 45, because of the multiplex reflection taking place between the outwardly oriented laser beam emitting end face 369a and the surface of the transparent resin 372, the laser beam fails to show a single peak characteristic and, therefore, the prior art laser device shown therein cannot be used as a light source in an optical disc recording and/or reproducing system. It is to be noted that in the graph of FIG. 45 a curve $\theta\|$ represents a pattern of distribution of the laser beam in a horizontal direction relative to an active layer and a curve $\theta\perp$ represents that in a vertical direction relative to the active layer.

Secondly, in the event that the transparent resin 372 is not properly coated so as to render the surface thereof to be parallel to the outwardly oriented laser beam emitting end face 369a, another problem arises in that due to a lens effect an optical axis tends to deviate. FIG. 46 illustrates the laser emission characteristic which has been exhibited when the surface of the transparent resin 372 fails to be parallel to the outwardly oriented laser beam emitting end face 369a. As can readily be understood from the graph of FIG. 46, the optical axis has deviated considerably and, therefore, the prior art laser device cannot be used as a light source in an optical disc recording and/or reproducing system.

Also, when the resin thickness attains a value exceeding 500 µm when the outwardly laser beam emitting end face 369a of the laser diode chip 369 is covered by the transparent resin 372, it can be contemplated to use two coating resins of dissimilar quality as material for the transparent resin 372 for the purpose of lessening a stress setup. However, even the use of the two coating resins to form the transparent resin 372 may result in a multiplex reflection of beam at an interface between each coating resin and the outwardly oriented laser beam emitting end face 369a, making it impossible for the laser device to be used as a light source in the optical disc recording and/or reproducing system.

The semiconductor laser device currently placed on the market is generally of such a structure as shown in FIG. 47 in a perspective view with a portion broken away. Referring to FIG. 47, the prior art semiconductor laser device comprises a stem 303 having a heat sink 304 mounted thereon. The heat sink 304 carries a semiconductor laser chip 301 mounted thereon and electrically connected with a terminal lead by means of a wire 307. The stem 303 also has a monitor photodiode chip 302 mounted thereon and electrically connected with a terminal lead 306 through a wire 308. The semiconductor laser chip 301 and the monitor photodiode chip 302 both mounted on the stem 303 are substantially hemispherically sealed by a cap 310 having a beam exit glass window 309 formed therein.

In the prior art semiconductor laser device of the structure shown in FIG. 47, since the stem 303 and the cap 310 are component parts separate from each other and expensive, not only is assembly complicated and time-consuming, but reduction in size of the semiconductor laser device is difficult to achieve.

In view of the above, a further prior art semiconductor laser device shown in FIGS. 48 and 49 has been suggested. FIG. 48 illustrates a plan view of a carrier strip during the manufacture of semiconductor laser chips and FIG. 49 illustrates a cross-sectional view of a single semiconductor laser chip taken along the line A—A in FIG. 49.

As shown in FIG. 48, an insert-type lead frame 313 (in which a lead frame and retainer members are integrated together) has a plurality of leads 314 each having a semiconductor laser chip 311 mounted thereon. A monitor photodiode chip 312 is in turn mounted on an inner side of each semiconductor laser chip 311 which is covered by a resin layer 315.

Two parallel leads 316 and 317 extending parallel to and on respective side of each lead 314 and are retained in position by the respective lead 314 by means of an associated retaining member 318. Each semiconductor laser chip 311 and the associated monitor photodiode chip 312 are connected with the leads 316 and 317 by means of respective wires 319 and 320. By cutting root portions of the leads 314 from the lead frame 313, a corresponding number of semiconductor laser devices can be obtained.

According to the prior art semiconductor laser device shown in FIGS. 48 and 49, since the semiconductor laser chip 311 is covered by the resin layer 315, the use of the cap 310 such as used in the semiconductor laser device of FIG. 47 can be advantageously dispensed with. In addition, since the individual semiconductor laser chips 311 are formed on the insert-type lead frame 313, not only can the process of manufacture of the semiconductor laser devices be simplified, but the semiconductor laser devices which are inexpensive and compact in size can also be realized.

However, since each of the semiconductor laser device shown in FIGS. 48 and 49 is of a structure wherein the semiconductor laser chip 311, the monitor photodiode chip 312 and the wires 319 and 320 are covered by the resin layer or exposed bare to the outside, there is a problem in that the semiconductor laser device is susceptible to external force and requires an utmost care in handling.

As a further prior art semiconductor laser device, a metal package type is also available as shown in FIG. 50. The metal package type shown therein comprises a stem base 321, a stem 322 mounted on the stem base 321, a semiconductor laser chip 323 mounted on a lateral surface 322a of the stem 322, a monitor photodiode chip 324 mounted on the lateral surface 322a of the stem 322 at a location spaced from the semiconductor laser chip 323, and a detector photodiode chip 325 mounted on an upper surface 322b of the stem 322. The stem base 321 has a metal cap 326 mounted fixedly thereon so as to enclose the stem 322, said metal cap 326 having a glass window 330 formed on a top face of the metal cap 326. A glass block 327 having an upper surface formed with a hologram 327a is mounted atop the metal cap 326 so as to cover the glass window 330.

When the semiconductor laser device shown in FIG. 50 is in use, a first laser beam is emitted from the semiconductor laser chip 323 towards the monitor photodiode chip 324 and a second laser beam towards the glass window 330 in the metal cap 326. The second laser beam then pass through the glass window 330 and, also, the glass block 327 and emerges outwardly from the hologram 327a. The second laser beam emerging outwardly from the hologram 327a is, after having been reflected from an information carrier medium (not shown) such as, for example, an optical disc, incident upon the hologram 327a. The reflected second laser beam incident on the hologram 327a is diffracted by the hologram 327a so as to be incident on the detector photodiode chip 325.

In the prior art semiconductor laser device shown in FIG. 50, since the surface of the semiconductor laser chip 323 tends to be adversely affected by a moisture component contained in the atmosphere, accompanied by a reduction in laser emission characteristic, an inert gas is filled within the interior of the metal cap 326. Accordingly, not only because the semiconductor laser device shown in FIG. 50 requires the employment of an expensive inert gas and the expensive metal cap 326 having the glass window 330, but also because the filling of the inert gas and the fitting of the glass window 330 in the metal cap 326 require complicated assembling procedures, the semiconductor laser device as a whole tends to become costly.

SUMMARY OF THE INVENTION

The present invention has for its object to provide an improved semiconductor laser device which can be effectively and satisfactorily be used as a light source in an optical disc recording and/or reproducing apparatus with no loss of a single peak in a laser beam emission characteristic and also with no deviation of an optical axis.

Another object of the present invention is to provide an improved semiconductor laser device which is effective to sufficiently protect the semiconductor laser chip, the monitor photodiode chip and wires electrically connecting them with respective conductors and which can be easily manufactured in a compact size and at a reduced cost.

A further object of the present invention is to provide an improved semiconductor laser device wherein the semiconductor laser chip is covered by the resin layer to render the device as a whole to exhibit a satisfactory environmental stability.

According to one aspect of the present invention, a semiconductor laser device including a base, a semiconductor laser chip and a resin layer enclosing the laser chip. The resin layer is made of a single synthetic resin and covers an outwardly oriented beam emitting end face of the laser chip. Also, the resin layer has a thickness not greater than 500 μm and has a surface substantially parallel to the outwardly oriented beam emitting end face of the laser chip.

Thus, a laser beam is emitted from the outwardly oriented beam emitting end face of the semiconductor laser chip mounted on the base and covered by the resin layer made of a single synthetic resin. In addition, the resin layer covering the outwardly oriented beam emitting end face of the laser chip has a thickness not greater than 500 µm and, therefore, the laser beam emitted from the laser chip will not be adversely affected by a multiple reflection, permitting the beam emission characteristic to exhibit a single peak.

Also, a surface of the resin layer covering the outwardly oriented beam emitting end face of the laser chip lie parallel relative to the outwardly oriented beam emitting end face of the laser chip and, accordingly, no lens effect will occur relative to the laser beam emitted from the laser chip and, consequently, no optical axis deviate in the beam emission characteristic.

Preferably, the base may be a stem, and the semiconductor laser device may further comprise a monitor photodiode chip mounted on the stem at a position inwardly of the laser chip. In this arrangement, laser beams are emitted from the outwardly and inwardly oriented beam emitting end faces, respectively, of the laser chip mounted on the stem and covered by the resin layer made of the single synthetic resin. The use of the monitor photodiode mounted on the stem at a location inwardly of the laser chip is effective to monitor the power of the laser beam as the laser beam emitted from the inwardly oriented beam emitting end face of the laser chip is incident on the monitor photodiode chip.

In addition, since as hereinabove described the resin layer covering the outwardly oriented beam emitting end face of the laser chip has a thickness not greater than 500 µm and also has a surface lying parallel to the outwardly oriented beam emitting end face of the laser chip, the laser beam emitted outwardly from the outwardly oriented beam emitting end face of the laser chip exhibits a beam emission characteristic with no single peak lost and with no deviation in optical axis.

Alternatively, the base may be a lead frame and the laser chip may be mounted on one of leads of the lead frame through a sub-mount. In such case, the semiconductor laser device may further comprises a monitor photodiode mounted on the one of the leads at a position inwardly of the laser chip, so that a direction in which a light receiving surface of the monitor photodiode extends lies substantially perpendicular to an inwardly oriented beam emitting end face of the laser chip.

In this arrangement, the laser beam emitted from the outwardly oriented beam emitting end face of the laser chip mounted on the lead of the lead frame through the sub-mount and covered by the resin layer made of the single synthetic resin can exhibits a beam emission characteristic in which no single peak is lost and no optical axis deviates, since the resin layer covering the outwardly oriented beam emitting end face of the laser chip has a thickness not greater than 500 µm and also has a surface lying parallel to the outwardly oriented beam emitting end face of the laser chip.

On the other hand, the laser beam emitted from the inwardly oriented beam emitting end face of the laser chip can advantageously be monitored by the monitor photodiode mounted on the lead at the position inwardly of the laser chip.

Also alternatively, the base may be a lead frame, a portion of one of leads of the lead frame which is positioned inwardly of the laser chip is inclined so as to confront an inwardly oriented beam emitting end face of the laser chip. In such case, the monitor photodiode is mounted in the inclined portion of the one of the leads of the lead frame.

According to this alternative arrangement, the laser beam emitted from the outwardly oriented beam emitting end face of the laser chip mounted on the lead of the lead frame through the sub-mount and covered by the resin layer made of the single synthetic resin and having a thickness not greater than 500 µm and also has a surface lying parallel to the outwardly oriented beam emitting end face of the laser chip, can exhibits a beam emission characteristic in which no single peak is lost and no optical axis deviates, Also, the laser beam from the inwardly oriented beam emitting end face of the laser chip can advantageously be monitored by the monitor photodiode which is mounted on the lead at the location inwardly of the laser chip with its light receiving surface inclined so as to confront the inwardly oriented beam emitting end face of the laser chip since the laser beam efficiently and effectively impinge upon the light receiving surface of the monitor photodiode.

Again alternatively, the base may be a lead frame, a portion of one of leads of the lead frame which is positioned inwardly of the laser chip being inwardly recessed and, in such case, the monitor photodiode is mounted in the recessed portion in the one of the leads of the lead frame so that a direction in which a light receiving surface of the monitor photodiode extends lies substantially perpendicular to an inwardly oriented beam emitting end face of the laser chip.

Where the monitor photodiode is mounted in the recess, since the outwardly oriented beam emitting end face of the laser chip is covered by the resin layer which is made of the single synthetic resin, has a thickness not greater than 500 µm and also has a surface lying parallel to the outwardly oriented beam emitting end face of the laser chip, the laser beam emitted from the outwardly oriented beam emitting end face of the laser chip mounted on the lead of the lead frame through the sub-mount and covered by the resin layer made of the single synthetic resin and having a thickness not greater than 500 µm and also has a surface lying parallel to the outwardly oriented beam emitting end face of the laser chip, can exhibits a beam emission characteristic in which no single peak is lost and no optical axis deviates, Also, the power of the laser beam emitted from the inwardly oriented beam emitting end face of the laser chip can effectively impinge on the light receiving surface of the monitor photodiode mounted in the recess in the lead at a location inwardly of the laser chip is effectively monitored by the monitor photodiode.

According to a second aspect of the present invention, there is provided a semiconductor laser device including a base, a semiconductor laser chip and a resin layer enclosing the laser chip. In this device, a mount face where the laser chip is mounted is defined at a level higher than that of a light receiving surface of a monitor photodiode for receiving a laser beam emitted from a rear face of the laser diode chip. Both of the laser diode chip and monitor photodiode are mounted on the base so that the light receiving surface and a direction of emission of the laser beam from a rear beam emitting end face of the laser diode chip lie substantially perpendicular to each other, Preferably, a reference index may be provided on the base for die-bonding the laser diode chip at a predetermined position, and/or the resin layer enclosing the laser diode chip may have a resin thickness not smaller than 10 µm.

With the semiconductor laser device according to the second aspect of the present invention, not only can the efficiency of incidence of the laser beam upon the monitor photodiode be increased, but also the laser unit can be made compact in side. Also, the use of the reference index facilitates a productivity and also increases the accuracy of die-bonding. If the resin layer enclosing the laser diode chip has a resin thickness not smaller than 10 μm, the semiconductor laser device can effectively protected from any adverse effect brought about by ambient humidity.

According to a third aspect of the present invention, there is provided a semiconductor laser device comprising a base; a semiconductor laser chip mounted on the base; a resin layer enclosing the laser chip; a monitor photodiode chip mounted on the base and adapted to receive a laser beam emitted from the laser chip; a first wire for electrically connecting the laser chip with a first conductor; and a second wire for electrically connecting the photodiode chip with a second conductor; and a protective member integrally fitted to the base so as to enclose at least the laser chip, the photodiode chip and both of the first and second wires to thereby protect them from external forces.

In the semiconductor laser device according to this third aspect of the present invention, since at least the laser chip, the photodiode chip adapted to receive the laser beam emitted from the laser chip, the first wire used to electrically connect the laser chip with the first conductor and the second wire used to electrically connect the monitor photodiode with the second conductor are enclosed by the protective member fitted integrally to the base on which the laser chip and the photodiode chip are mounted and, therefore, they are protected from external forces.

Preferably, the base may be one of leads of a lead frame and the protective member is a generally cylindrical casing closed at one end by an end wall, the leads of the lead frame extending through the end wall of the casing.

In this case, since the laser chip, the monitor photodiode chip, both mounted on the lead of the lead frame which extends through an end wall into the interior of the cylindrical casing closed at one end by the end wall, and the first and second wires connected respectively with these chips are enclosed by the protective member so as to be protected from external forces.

Alternatively, the base, the first conductor and the second conductor may be constituted by the leads of the lead frame, respectively, and wherein the protective member is a generally cylindrical casing closed at one end by an end wall and having an inner peripheral surface formed with at least two grooves extending axially thereof, the protective member being integrally fitted to the leads with outermost two of the leads being received within the respective grooves.

According to this alternative arrangement, when the cylindrical casing closed at one end by the end wall is to be mounted on the lead frame having one of the leads, on which the laser chip and the monitor photodiode, both covered by the resin layer, are mounted and the others of the leads electrically connected with the laser chip and the monitor photodiode by means of the respective first and second wires, the grooves formed in the inner peripheral surface of the protective casing so as to extend axially thereof serve as guides for the leads after the outermost leads on respective sides of said one of the leads have been received in the associated grooves.

The protective member may of a closed structure having an aperture defined therein for passage therethrough of a laser beam emitted from the laser chip so as to travel outwardly of the protective member, the protective member having an interior surface coated with a light absorbing layer.

In such case, since the protective member enclosing the laser chip, the monitor photodiode and the wires is of a closed structure having an aperture defined therein for passage therethrough of a laser beam emitted from the laser chip so as to travel outwardly of the protective member, any possible entry of external light into the protective member through the hole can advantageously be minimized. Also, a slight amount of light entering through the hole into the protective member can be absorbed by the light absorbing layer. Therefore, by minimizing the influence which may be brought about by the external light, the intensity of the laser beam emitted outwardly from the laser chip can be controlled accurately.

Again alternatively, the protective member may include an optical member positioned on a path of travel of a laser beam emitted from the laser chip so as to travel outwardly of the protective member.

In the case of the use of the optical member, the laser beam emitted outwardly from the laser chip passes through the optical member. And, the laser beam dependent on characteristics of the optical member can be emitted to the outside.

In any event, the protective member may have a reference face defined therein for determination of a reference position referred to when the base having the laser chip mounted thereon is to be installed in an external equipment.

When the base having the laser chip mounted thereon is to be installed in an external equipment, the reference face provided in the protective member is brought into abutment with a reference face of the equipment and, therefore, the positioning of the semiconductor laser device relative to the equipment can advantageously be controlled accurately.

According to a fourth aspect of the present invention, there is provided a semiconductor laser device which comprises a stem; a semiconductor laser chip mounted on the stem; a monitor photodiode chip mounted on the stem and adapted to receive a laser beam emitted from the laser chip; a cap mounted on the stem so as to enclose the laser chip and the photodiode chip; and a hologram mounted on the cap for guiding a reflected beam of the laser chip. This semiconductor laser device may or may not include one or both of a detector photodiode for detecting a reflected beam of the laser chip and a transparent resin layer enclosing at least the laser chip among the laser chip, the monitor photodiode and the detector photodiode.

In the semiconductor laser device according to the fourth aspect of the present invention, even though the cap is employed, neither expensive inert gas is employed, nor expensive metal cap having a window covered by a windowpane such as in the prior art device is required. Accordingly, as compared with the prior art semiconductor laser device, the device can be manufactured at a reduced cost without requiring any complicated assembling procedure and having an excellent environmental stability.

BRIEF DESCRIPTION OF THE DRAWINGS

This and other objects and features of the present invention will become clear from the following description taken in conjunction with preferred embodiments thereof with reference to the accompanying drawings, in which like parts are designated by like reference numerals and in which.

DETAILED DESCRIPTION OF THE EMBODIMENTS

Figure 1:
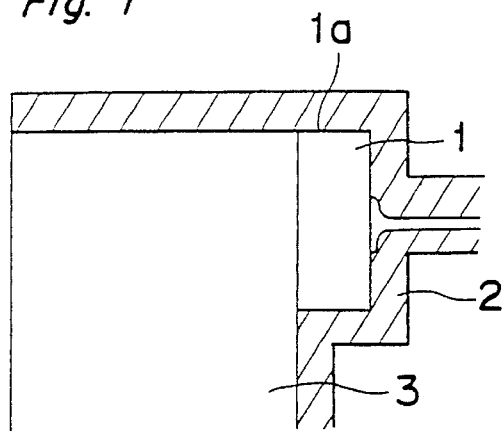
FIG. 1 is a fragmentary sectional view of a portion of a semiconductor laser device according to a first embodiment of the present invention.

Referring first to FIG. 1 showing a semiconductor laser device according to a first preferred embodiment of the present invention, there is shown a stem 3 (which may alternatively be a lead frame) and a laser diode chip 1 die-bonded to an outer end of the stem 3.

A region ranging from the outer end of the stem 3 to an upper surface of the stem 3 via a surface of the laser diode chip 1 is covered by a resin layer 2. The resin layer 2 is so coated that a portion of the resin layer 2 confronting an outwardly oriented laser beam emitting end face 1a (hereinafter referred to as a forward emitting end face) of the laser diode chip 1 has a resin thickness not greater than 500 μm while lying flat in parallel relation to the forward emitting end face. The resin layer 2 may be made of a transparent synthetic resin such as, for example, silicone resin or polyimide resin.

Figure 2:
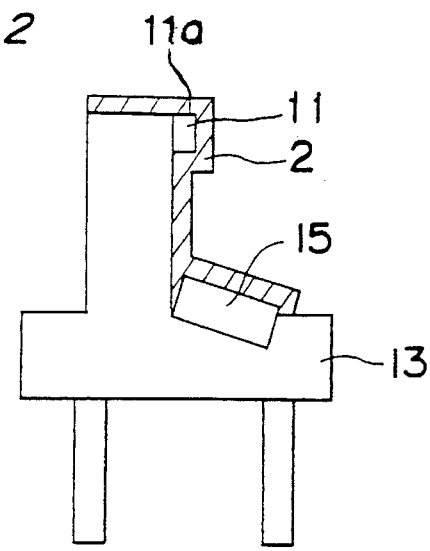
FIG. 2 is a fragmentary sectional view of a portion of the semiconductor laser device according to a second embodiment of the present invention.

FIG. 2 illustrates the semiconductor laser device according to a second preferred embodiment of the present invention. In this embodiment, a laser diode chip 11 is die-bonded to a tip of a vertical arm of the shape of a figure "T" assumed by a generally T-sectioned stem 13 so that a forward emitting end face 11a of the laser diode chip 11 may lay in flush with an end face at the tip of the stem 13. At a position corresponding to the joint between vertical and transverse arms of the shape of the figure "T", a monitor photodiode 15 is die-bonded to a portion of the transverse arm of the stem 13 adjacent the vertical arm thereof.

Even in the embodiment shown in FIG. 2, the resin layer 2 is applied to the stem 13 so as to cover a region ranging from the end face of the vertical arm of the stem 13 to that portion of the transverse arm of the stem 13 adjacent the vertical arm thereof so while covering both of the laser diode chip 11 and the monitor photodiode 15. As a matter of course, a portion of the resin layer 2 confronting the forward emitting end face 11a of the laser diode chip 11 has a resin thickness not greater than 500 μm and lie flat in parallel relation to the forward emitting end face 11a of the laser diode chip 11.

Figure 3:
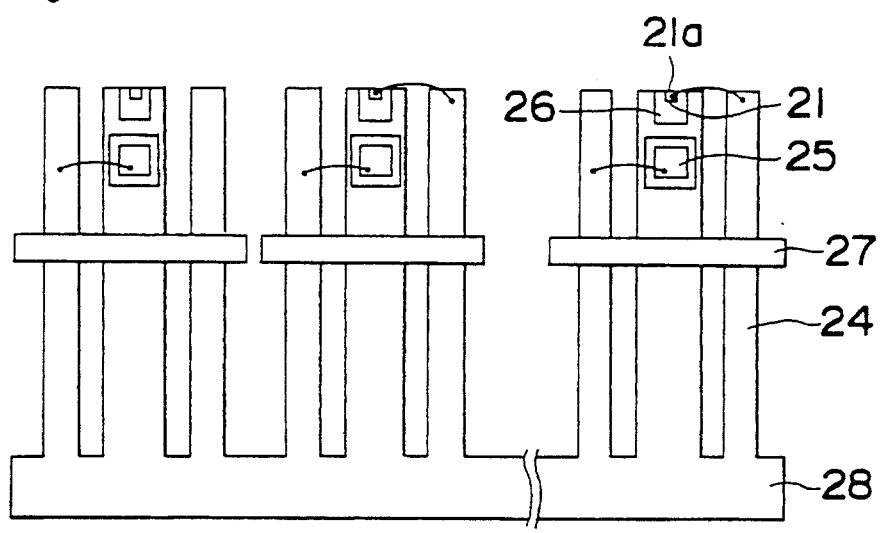
FIG. 3 is a plan view of the semiconductor laser device according to a third preferred embodiment of the present invention.
Figure 4:
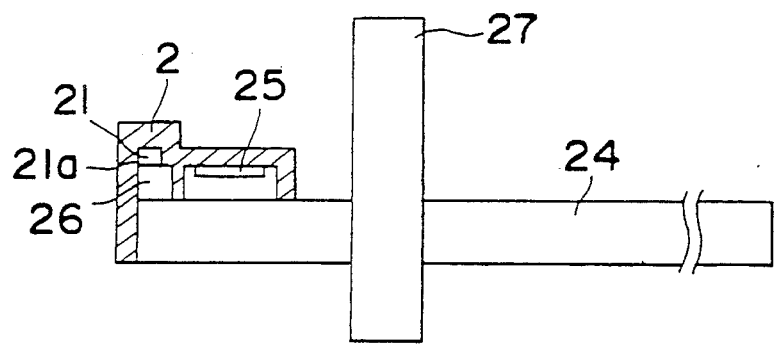
FIG. 4 is a longitudinal sectional view of the semiconductor laser device of FIG. 3 as viewed in a different direction.

FIGS. 3 and 4 illustrates the semiconductor laser device according to a third preferred embodiment of the present invention. According to this embodiment, in order to increase the productivity, a plurality of laser diode chips 22 and a corresponding number of monitor photodiodes 25 are mounted on leads 24. At this time, each laser diode chip 21 is die-bonded through a sub-mount 26 in consideration of the amount of light incident on the corresponding monitor photodiode 25. It is to be noted that reference numeral 21a represents a forward emitting end face of each laser diode chip 21 and reference numeral 28 represents a tie bar.

In the semiconductor laser device shown in FIG. 3, the laser chips 21 and the monitor photodiodes 25 are mounted through the associated sub-mounts 26 on the leads of an insert-type lead frame 24 and 27 (a type of lead frames integrally formed with retainer members 27 made of plastics). Although not shown, a resin layer is formed so as to cover the forward emitting end face 21a of each laser diode chip 21, and that portion of the resin layer confronting the forward emitting end face 21a of each laser diode chip 21 has a resin thickness not greater than 500 μm while lying flat in parallel relation thereto.

On the other hand, in the semiconductor laser device shown in FIG. 4, one lead 24 separated from the tie bar has the laser diode chip 21 and the monitor photodiode 25 mounted thereon. Both of the laser diode chip 21 and the monitor photodiode 25 are covered by the resin layer 2, that portion of the resin layer 2 confronting the forward emitting end face 21a of the laser diode chip 21 having a thickness not greater than 500 μm while lying flat in parallel relation to the forward emitting end face 21a.

It is to be noted that a structure may be contemplated in which the monitor photodiode 25 and the sub-mount 26 are integrated together.

Figure 5:
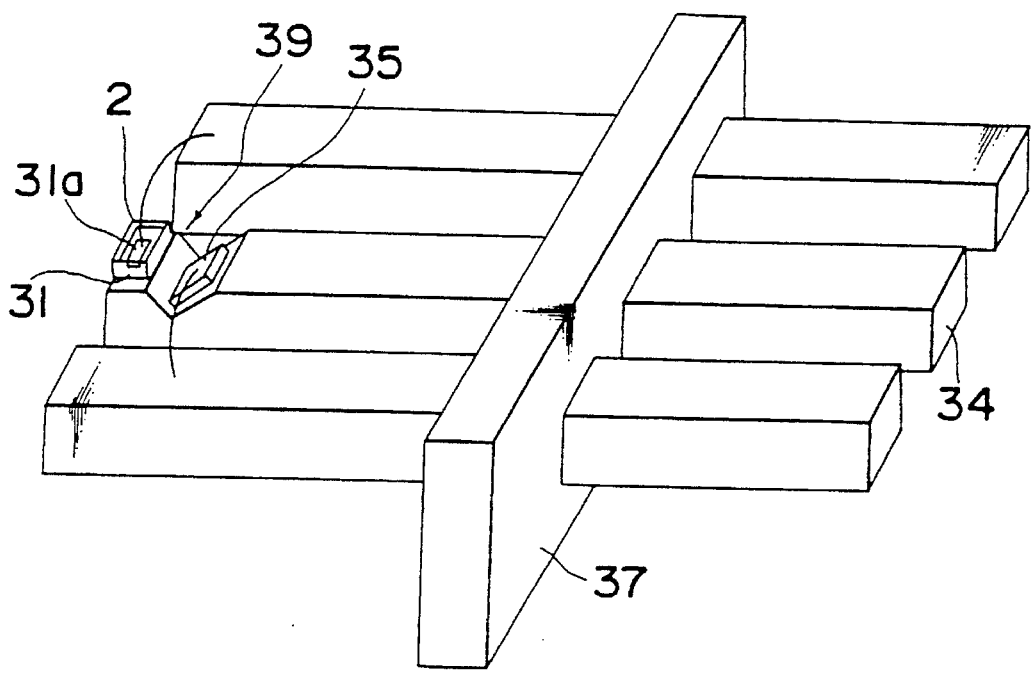
FIG. 5 is a perspective view of the semiconductor laser device according to a fourth embodiment of the present invention.
Figure 6:
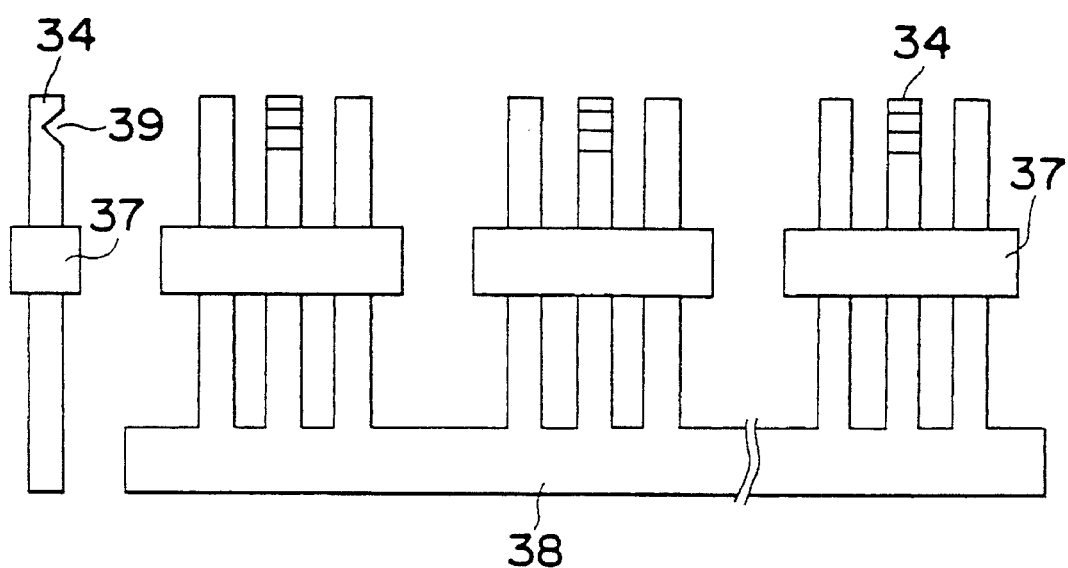
FIG. 6 is a schematic plan view showing a lead frame shown in FIG. 5.

Referring now to FIGS. 5 and 6 showing a fourth preferred embodiment of the present invention, the semiconductor laser device shown therein is prepared by punching a portion of a lead 34, where a monitor photodiode 35 will be die-bonded, to form a generally V-shaped groove 39 so as to leave a mount surface area adjacent the tip of the lead 34, die-bonding a laser diode chip 31 to the mount surface area of the lead 34 and finally die-bonding the monitor photodiode 35 to one of opposite faces of the V-shaped groove 39 generally diagonally facing towards the laser diode chip 31. Even in this embodiment, both of the laser diode chip 31 and the monitor photodiode 35 are covered by the resin layer 2, that portion of the resin layer 2 confronting a forward emitting end face 31a of the laser diode chip 31 having a thickness not greater than 500 μm while lying flat in parallel relation to the forward emitting end face 31a.

FIG. 6 illustrates the shape of a lead frame connecting a plurality of the leads 34 of FIG. 5 through a tie bar 38, which lead frame is used during the manufacture of the semiconductor laser device shown in FIG. 5.

As hereinabove described, in the fourth preferred embodiment of the present invention, since the monitor photodiode 35 is die-bonded to one of the opposite faces of the V-shaped groove 39 in the lead 34 which faces towards the laser diode chip 31 die-bonded on the mount surface area adjacent the tip of such lead 34, a laser beam emitted from the laser diode chip 31 can with no doubt impinge on the monitor photodiode 35. Accordingly, no sub-mount such as necessitated in the third preferred embodiment of the present invention is required.

Figure 7:
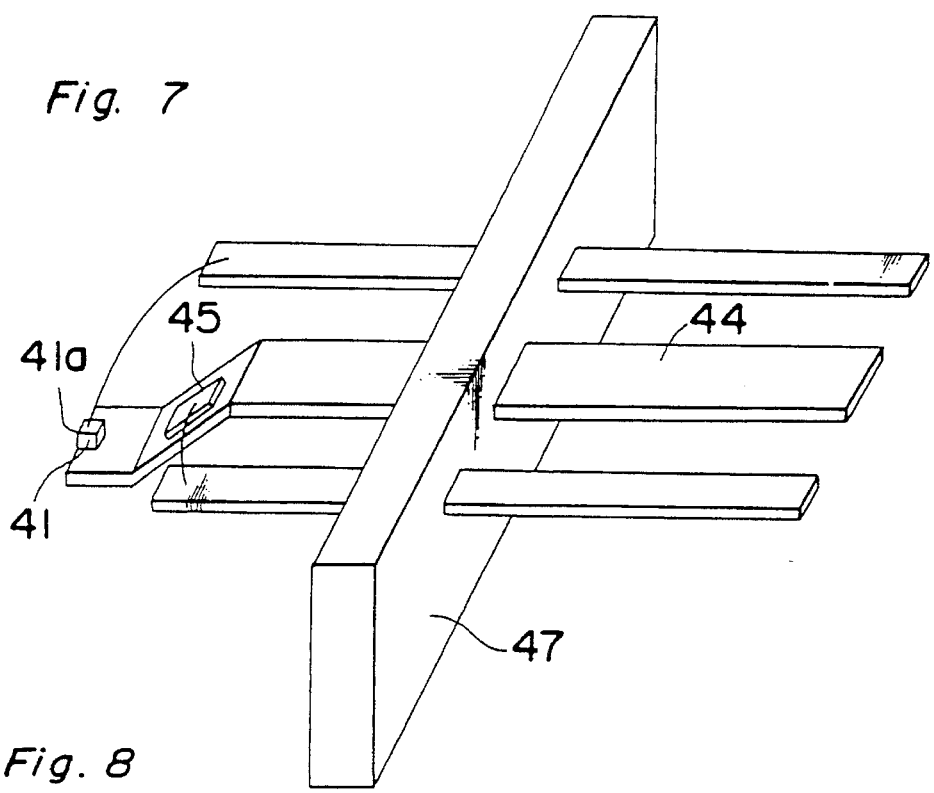
FIG. 7 is a perspective view of the semiconductor laser device according to a fifth embodiment of the present invention.
Figure 8:
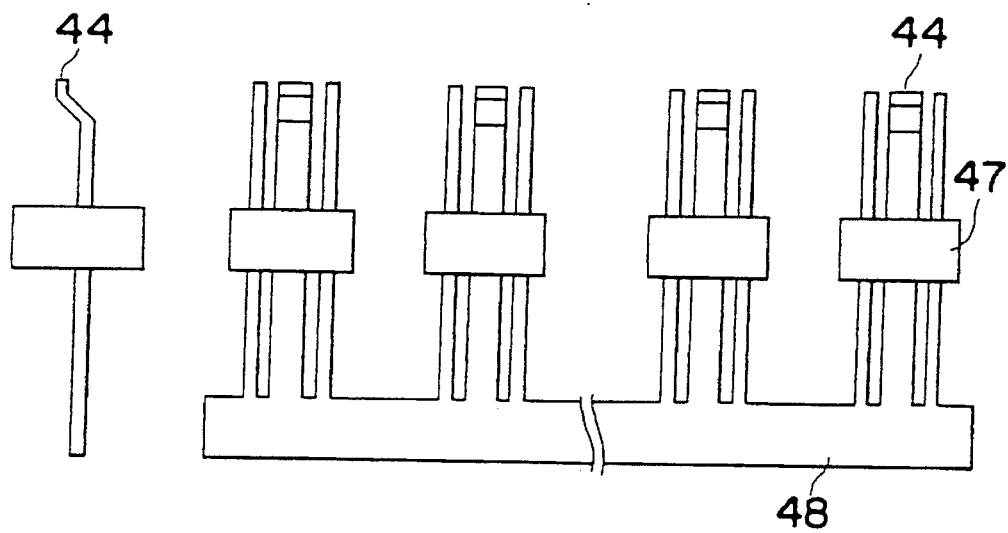
FIG. 8 is a schematic plan view showing the lead frame shown in FIG. 7.

The semiconductor laser device according to a fifth preferred embodiment of the present invention is shown in FIGS. 7 and 8. According to this embodiment, a portion of a lead 44 where a monitor photodiode 45 is disposed is so shaped as to face outwardly in a direction axially of the lead 44 so that the amount of light emitted from a laser diode chip 41, mounted on the tip of the lead 44, and incident upon the monitor photodiode 45 can be increased.

FIG. 7 illustrates a condition prior to the semiconductor laser chip 41 and its surrounding being covered by the resin layer. Even in this embodiment, when the laser diode chip 41 is covered by the resin layer, that portion of the resin layer aligned with a forward emitting end face 41a of the laser diode 41 must have a resin thickness not greater than 500 μm and, at the same time, must lie flat in parallel relation to the forward emitting end face 41a of the laser diode 41.

FIG. 8 illustrates the shape of a lead frame connecting a plurality of the leads 44 of FIG. 7 through a tie bar 48, which lead frame is used during the manufacture of the semiconductor laser device shown in FIG. 7. In FIG. 8, reference numeral 47 represents a retaining member.

Figure 9:
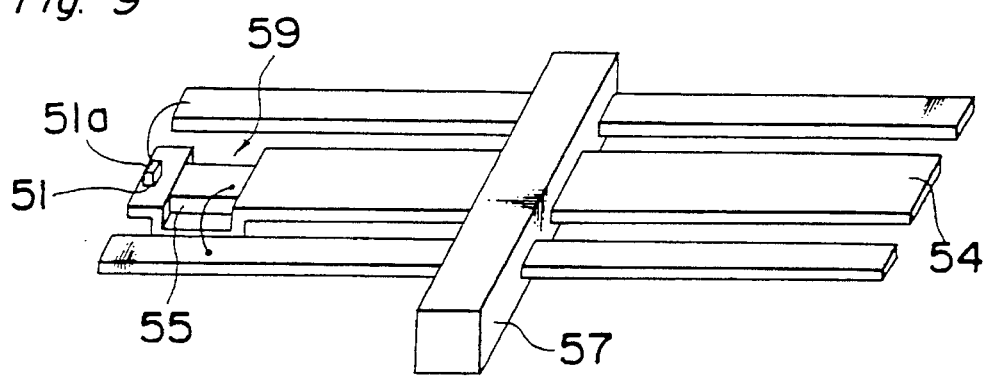
FIG. 9 is a perspective view of the semiconductor laser device according to a sixth embodiment of the present invention.
Figure 10:
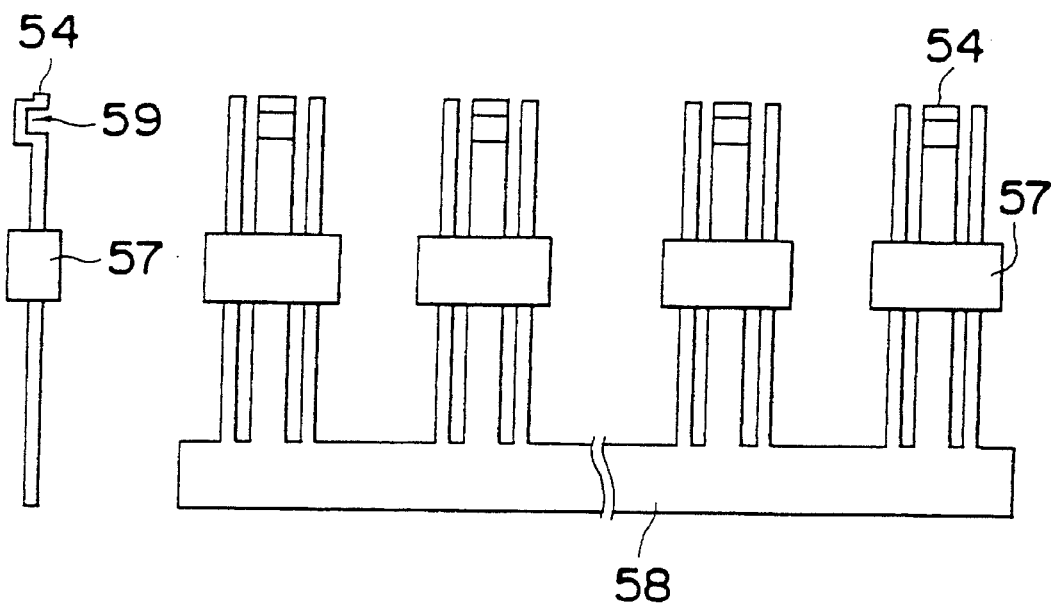
FIG. 10 is a schematic plan view showing the lead frame shown in FIG. 9.

A sixth preferred embodiment of the present invention is shown in FIGS. 9 and 10. According to this sixth embodiment of the present invention, a tip of a lead 54 is so shaped as to provide a generally U-shaped groove 59 within which a monitor photodiode 55 is mounted. A surface area on which the monitor photodiode 55 is mounted is substantially parallel to, but offset relative to a mount surface area on which a laser diode chip 51 is mounted while enabling the beam from the laser diode chip 51 to be incident upon the monitor photodiode 45.

FIG. 9 illustrates a condition prior to the semiconductor laser chip 51 and its surrounding being covered by the resin layer. Even in this embodiment, when the laser diode chip 51 is covered by the resin layer, that portion of the resin layer aligned with a forward emitting end face 51a of the laser diode 51 must have a resin thickness not greater than 500 μm and, at the same time, must lie flat in parallel relation to the forward emitting end face 51a of the laser diode 51.

FIG. 10 illustrates the shape of a lead frame connecting a plurality of the leads 54 of FIG. 9 through a tie bar 58, which lead frame is used during the manufacture of the semiconductor laser device shown in FIG. 9. In FIG. 10, reference numeral 57 represents a retaining member.

Figure 11:
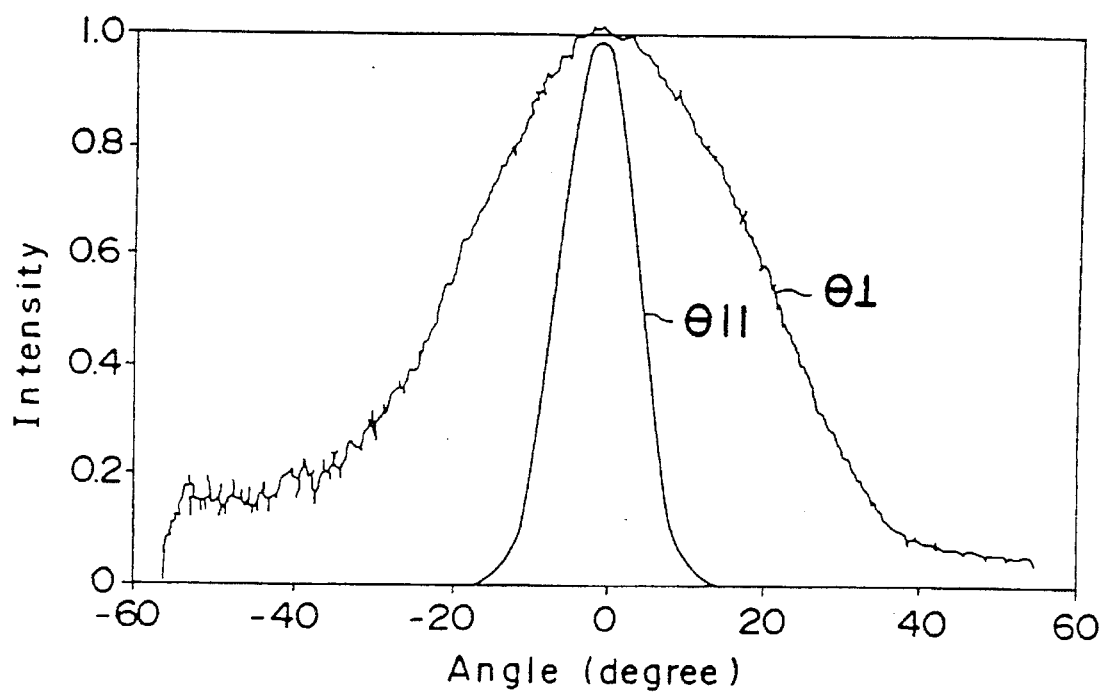
FIG. 11 is a graph showing a laser emission characteristic exhibited by the semiconductor laser device of the present invention.

FIG. 11 illustrate a laser emission characteristic exhibited by the semiconductor laser device which, as shown in connection with any one of the foregoing embodiments of the present invention, the forward emitting end face of the laser diode chip is covered by the resin layer lying parallel thereto and having a resin thickness not greater than 500 μm. As can be seen from the laser emission characteristic shown in FIG. 11, since the forward emitting end face of the semiconductor laser chip is covered by the resin layer of 500 μm in resin thickness and made of a single synthetic resin, both of a curve θ∥ representing a pattern of distribution of the laser beam in a horizontal direction relative to an active layer in which a laser oscillation takes place and a curve θ⊥ representing that in a vertical direction relative to the active layer exhibits a single peak.

Also, since that portion of the resin layer aligned with the forward emitting end face of the semiconductor laser chip lies parallel to such forward emitting end face, both of the curves shown in the graph of FIG. 11 exhibit no deviation of the optical axis.

Thus, according to any one of the foregoing embodiments, the present invention has made it possible to provide the semiconductor laser device which can be effectively used as a light source in an optical disc recording and/or reproducing system to the best advantage.

It is to be noted that, in the practice of any one of the foregoing embodiments of the present invention, the resin thickness of the resin layer suffices to be not greater than 500 μm. Even when the resin thickness is chosen to be 400, 300, 200 or 100 μm, the resultant semiconductor laser device can exhibit satisfactory characteristics. However, if the resin thickness is too small, corrosion may occur at the forward emitting end face of the semiconductor laser chip under the influence of ambient humidity and this may lead to a considerable variation in electric operating current of the laser device and, therefore, the minimum allowable resin thickness is preferably 10 μm.

From the foregoing description, it has now become clear that, according to one aspect of the present invention, since the forward emitting end face of the semiconductor laser chip is covered by the resin layer of not greater than 500 μm in resin thickness while lying parallel thereto, the laser beam emitted from the outwardly oriented laser emitting end face of the semiconductor laser chip can exhibit such a laser emission characteristic that there is no possibility of loosing a single peak and, yet, there is no deviation of the optical axis. Accordingly, the present invention has made it possible to provide the semiconductor laser device which can be effectively used as a light source in an optical disc recording and/or reproducing system to the best advantage.

It is also clear that, according to another aspect of the present invention, since the monitor photodiode is mounted on a portion of the stem inwardly of the semiconductor laser chip, the monitor photodiode can monitor the power of the laser beam emitted from the semiconductor laser chip. Accordingly, it is possible for the monitor photodiode to monitor the laser beam having such a laser emission characteristic that there is no possibility of loosing a single peak and, yet, there is no deviation of the optical axis.

It is further clear that, according to a further aspect of the present invention, the monitor photodiode can receive the laser beam emitted from the inwardly oriented beam emitting end face of the semiconductor laser chip since the semiconductor laser chip is mounted on the lead through the sub-mount while the monitor photodiode is mounted on that portion of the lead inwardly of the semiconductor laser chip whereby a light receiving surface of the monitor photodiode extend vertical relative to the inwardly oriented beam emitting end face of the semiconductor laser chip. Accordingly, it is clear that the power of the laser beam having such a laser emission characteristic that there is no possibility of loosing a single peak and, yet, there is no deviation of the optical axis can be monitored effectively.

According to a further aspect of the present invention, since the monitor photodiode is mounted in the groove formed in the lead at a location inwardly of the semiconductor laser chip with the light receiving surface thereof extending vertical relative to the inwardly oriented beam emitting end face of the semiconductor laser chip, the monitor photodiode can easily receive the laser beam emitted from the inwardly oriented beam emitting end face of the semiconductor laser chip. Accordingly, it is clear that the power of the laser beam having such a laser emission characteristic that there is no possibility of loosing a single peak and, yet, there is no deviation of the optical axis can be monitored effectively.

Figure 12:
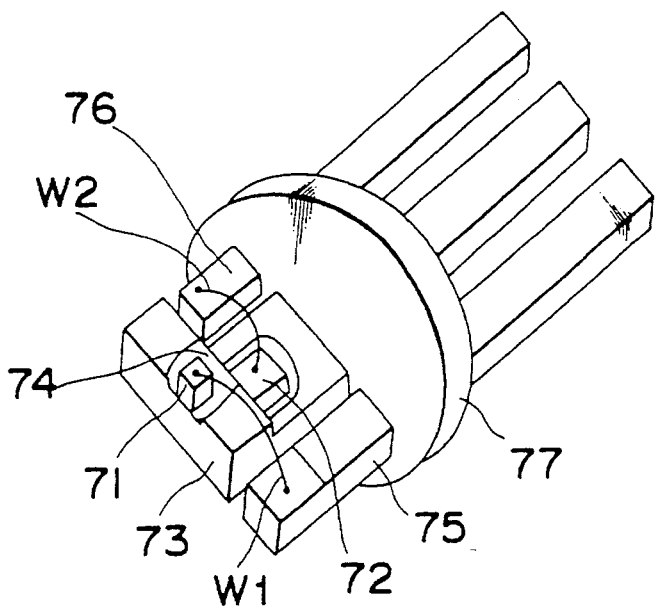
FIG. 12 is a schematic perspective view of the semiconductor laser device according to a seventh embodiment of the present invention.
Figure 13:
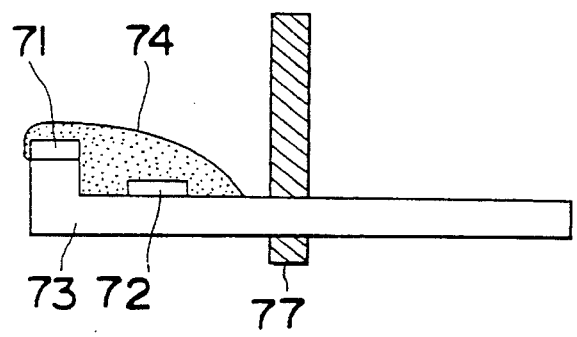
FIG. 13 is a center longitudinal sectional view of the semiconductor laser device shown in FIG. 12.

A seventh preferred embodiment of the present invention will now be described with reference to FIGS. 12 to 15. Referring particularly to FIGS. 12 and 13, a laser diode chip 71 and a photodiode 72 are mounted on a lead frame pin 73 and are hermetically sealed by a transparent resin layer 74. It is to be noted that a portion of the lead frame pin 73 where the laser diode chip 21 is mounted is raised to a level somewhat higher than the level of another portion of the lead frame pin 73 where the photodiode 72 is mounted. Specifically, the photodiode 72 is so mounted on a surface of the lead frame pin 73 that a rear beam emitting end face of the laser diode chip 21 may lie perpendicular to a light receiving surface of the photodiode 72.

The laser diode chip 21 and the photodiode 72, both mounted on the lead frame pin 75, are electrically connected with the lead frame pin 75 and a lead frame pin 76 by means of respective wires W1 and W2.

Figure 14:
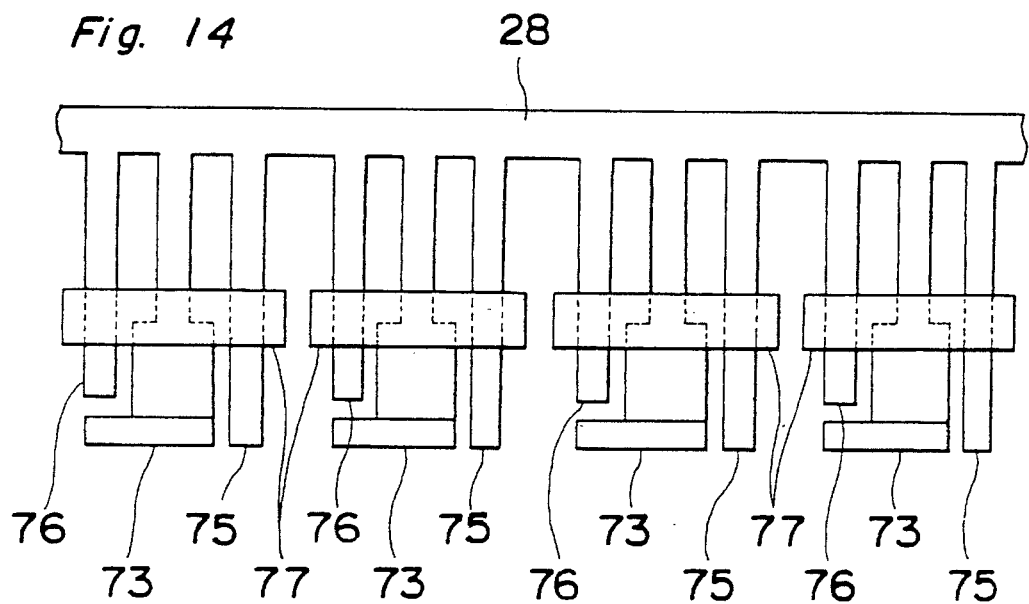
FIG. 14 is a plan view showing the lead frame used to manufacture the semiconductor laser device shown in FIG. 12.

The semiconductor laser device of the above described construction shown in and described with particular reference to FIGS. 12 and 13 can be prepared in the following manner. As shown in FIG. 14, a plurality of sets of lead frame pins 73, 75 and 76 connected together by means of a tie bar 78 in a predetermined pattern is used with each set of the lead frame pins 73, 75 and 76 fixed in position by a corresponding fixture 77 of synthetic resin. After the laser diode chip 71 and the photodiode 72 have been mounted on each lead frame pin 73 with the wires W1 and W2 bonded thereto so as to extend from the laser diode chip 71 to the lead frame pin 75 and from the photodiode 72 to the lead frame pin 76, respectively, both of the laser diode chip 21 and the photodiode 22 on each lead frame pin 72 are sealed by the transparent resin 24, following separation of the sets of the lead frame pins 73, 75 and 76 from the tie bar 78 by the use of any know cutting technique, thereby completing the semiconductor laser devices.

Figure 15:
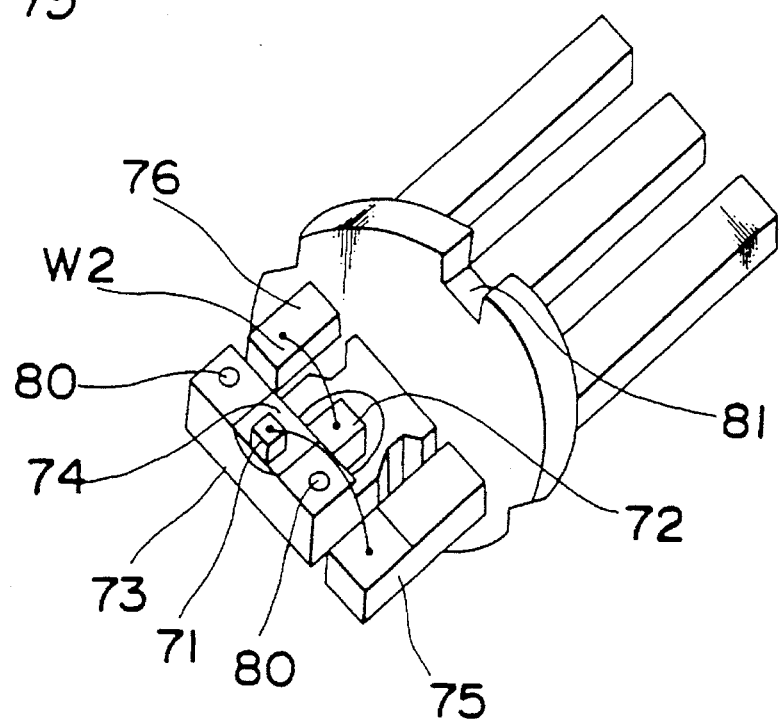
FIG. 15 is a schematic perspective view of the semiconductor laser device according to an eighth embodiment of the present invention.
Figure 16:
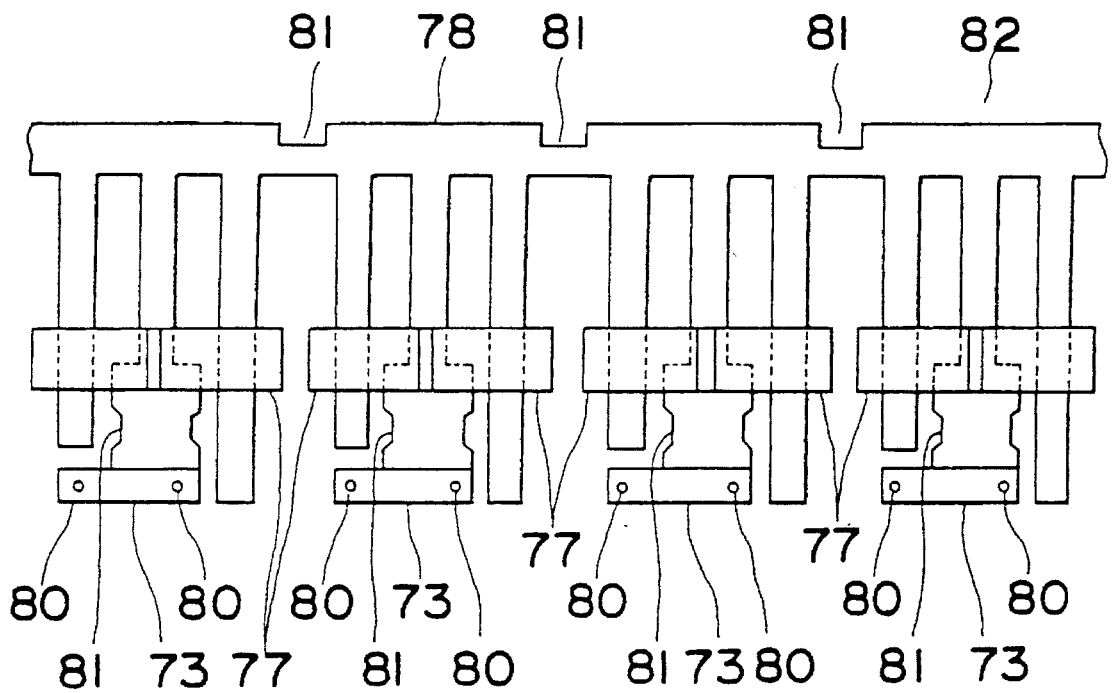
FIG. 16 is a plan view showing the lead frame used to manufacture the semiconductor laser device shown in FIG. 15.

FIGS. 15 and 16 illustrate an eighth preferred embodiment of the present invention. This eighth embodiment of the present invention differs from the previously discussed seventh embodiment of the present invention in that, as best shown in FIG. 16, each set of the lead frame pins 73, 75 and 76 with the corresponding fixture 78 and the tie bar 79 are formed with positioning holes 80 and positioning grooves 81.

The use of the positioning holes 80 and the positioning grooves 81 is advantageous in that an lead frame pin assembly 82 can easily be positioned to allow the laser diode chip 71 and the photodiode 72 to be accurately mounted on each lead frame pin 73 at the respective predetermined positions.

Figures 17, 18:
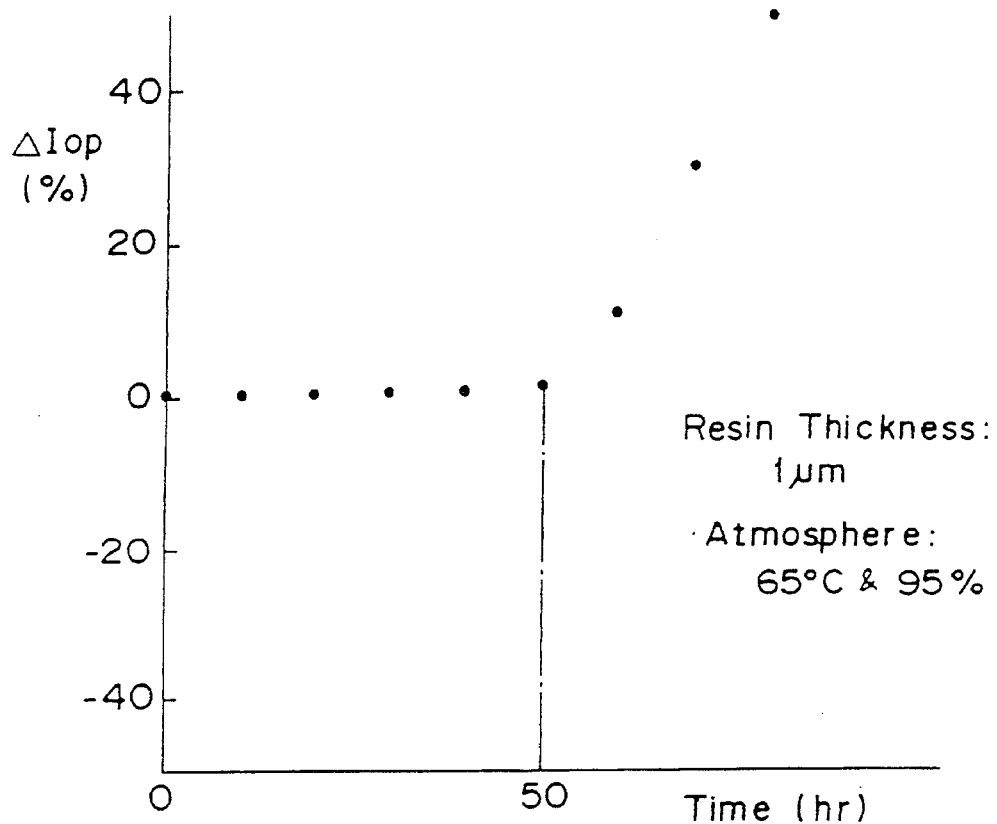
FIG. 17 is a chart showing the relationship between the resin thickness and the deterioration time of the semiconductor laser device according to a ninth embodiment of the present invention.
FIG. 18 is a graph showing the relationship between the standing time, during which the semiconductor laser beam has been allowed to stand, and the rate of change in operating current.
Figure 19:
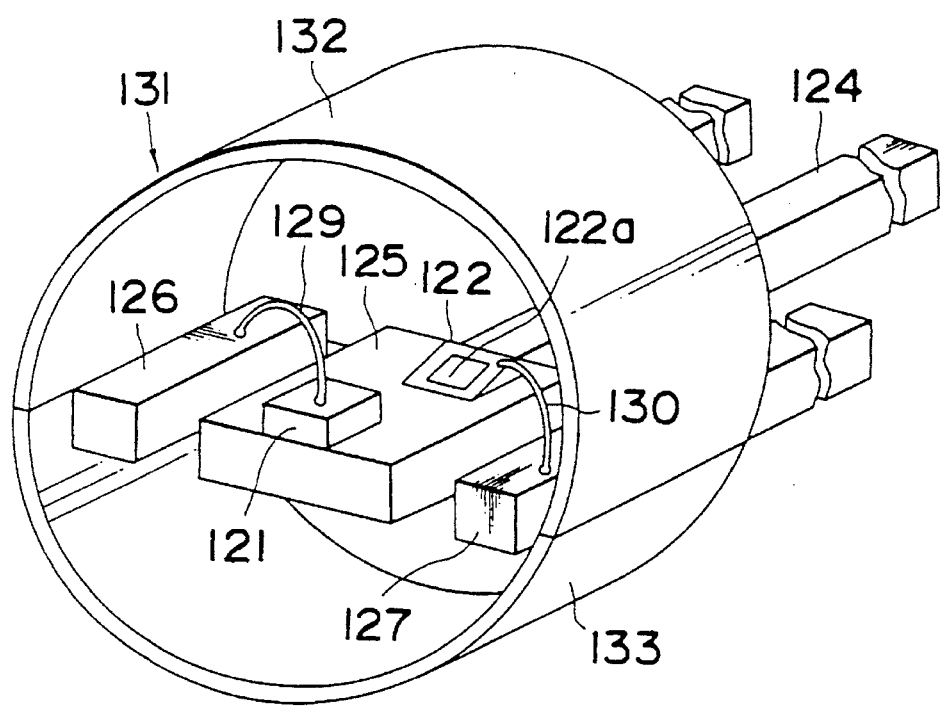
FIG. 19 is a schematic perspective view showing the semiconductor laser device according to a tenth embodiment of the present invention.

FIG. 17 illustrates a relationship between the resin thickness of a transparent resin layer 34, used to seal both of the laser diode chip 81 and the photodiode 82 in the semiconductor laser device according to a ninth preferred embodiment of the present invention, and a phenomenon of deterioration of the semiconductor laser device. Data shown in FIG. 17 speak of results of experiments in which seven semiconductor laser devices having the respective resin layers of different resin thicknesses were allowed to stand under an atmosphere of 65° C. in temperature and 95% in absolute humidity and a change in laser operating current was examined every 50 hours. FIG. 18 illustrates the relationship between the length of time H during which the semiconductor laser device having the resin layer of 0.1 µm was allowed to stand and the amount of change ΔIop in operating current.

As can readily be understood from FIGS. 17 and 18, when the resin thickness of the resin layer sealing both of the laser diode chip and the photodiode is equal to or smaller than 10 µm, deterioration was observed. However, when the resin thickness is greater than 10 µm, no deterioration was observed. This clearly suggests that the resin layer sealing the laser diode chip and the photodiode should have a resin thickness greater than 10 µm.

According to the seventh embodiment of the present invention, the efficiency of incidence of the laser beam upon the monitor photodiode can be increased and, also, the laser unit can be assembled in a compact size.

According to the eighth embodiment of the present invention, the positioning of the read frame can be accurately performed and, therefore, not only can both of the laser diode chip and the photodiode be accurately mounted on each lead frame to thereby increase the productivity, but the accuracy of the semiconductor laser device can also be increased.

In addition, the selection of the resin thickness of the resin layer to be greater than 10 µm is effective to avoid any possible deterioration under the influence of ambient humidity, making it possible to provide the semiconductor laser device having an excellent environmental stability.

A tenth preferred embodiment of the present invention is shown in FIGS. 19 to 22. In the semiconductor laser device according to the tenth embodiment of the present invention is prepared from an insert-type flat lead frame 123 best shown in FIG. 21. The insert-type flat lead frame 123 has common leads 124 on which respective semiconductor laser chips are mounted.

Figure 20:
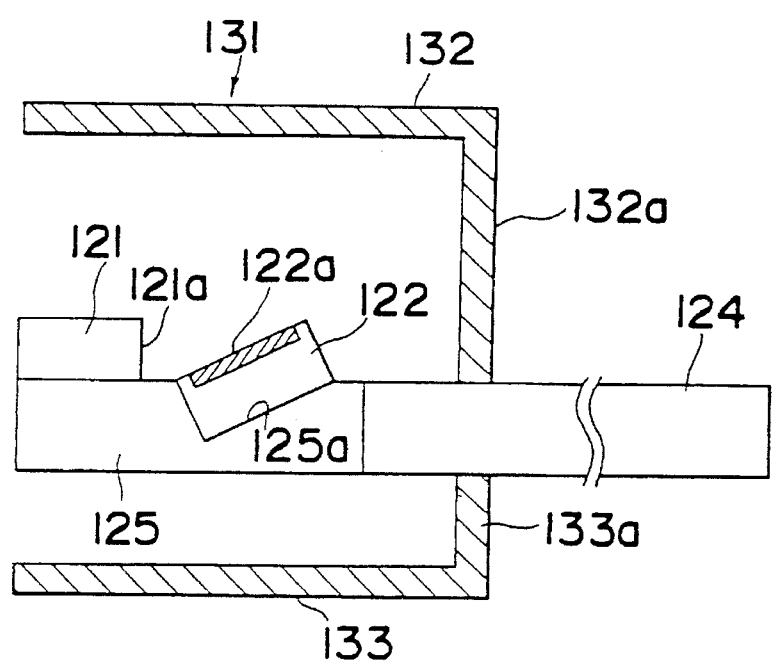
FIG. 20 is a schematic longitudinal sectional view of the semiconductor laser device shown in FIG. 19.

More specifically, each of the common leads 124 has a tip formed with a chip mount 125. A respective semiconductor laser chip 121 is mounted on an upper surface of the chip mount 25. This chip mount 125 is in turn formed with a generally U-shaped recess 125a having a generally V-shaped longitudinal section and positioned inwardly of the semiconductor laser chip 121 on the chip mount 125 as best shown in FIG. 20. A respective monitor photodiode chip 122 is subsequently mounted in the recess 125a with a front lower corner thereof sunk deep into the recess 125a while a light receiving surface 122a thereof is so inclined as to confront an inwardly oriented beam emitting end face 121a of the semiconductor laser chip 121.

Each semiconductor laser chip 121 and each monitor photodiode chips 122 are electrically connected through wires 129 and 130 with leads 126 and 127 positioned on respective sides of the associated common lead 124, respectively. Thereafter, the semiconductor laser chip 121, the monitor photodiode chip 122 and the wires 129 and 130 associated with each common lead 124 are encapsulated by a resin layer not shown).

By so doing, a laser beam emitted from an inwardly oriented beam emitting end face of the respective semiconductor laser chip 121 in a direction inwardly thereof can be efficiently impinged upon the light receiving surface 122a of the associated monitor photodiode chip 122 to achieve a monitoring of the power of the laser beam.

The semiconductor laser device according to the tenth embodiment of the present invention has the semiconductor laser chip 121, the monitor photodiode 122 and the wires 129 and 130 all encased within a generally cylindrical protective casing 131 made of plastics and having one end closed, to thereby protect the semiconductor laser chip 121, the monitor photodiode 122 and the wires 129 and 130 from external forces.

Figure 22:
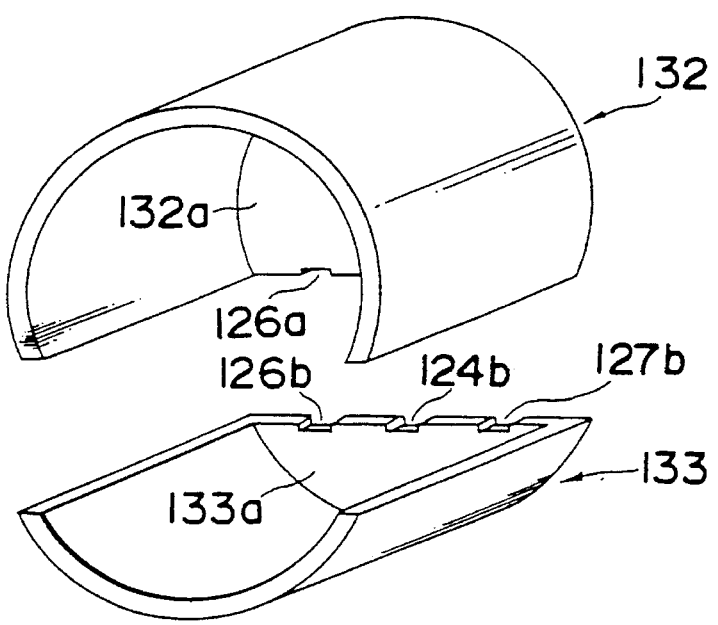
FIG. 22 is a perspective view of a protective member used in the semiconductor laser device of FIG. 19, showing how the protective member is assembled.

As best shown in FIG. 22, the cylindrical protective casing 131 is comprised of generally semicylindrical, upper and lower casing components 132 and 133 which are so divided at a level where the leads 124, 126 and 127 extends through an end wall of the cylindrical protective casing 131. A generally semicircular end wall 132a or 133a of each of the upper and lower casing components 132 and 133 has an edge portion formed with cutouts 124a, 126a and 127a for accommodating the leads 124, 126 and 127, respectively, in cooperation with the cutouts 124a, 126a and 127a defined in the other semicircular end wall 133a or 132a when the upper and lower casing components 132 and 133 are combined together to complete the cylindrical protective casing 131.

Figure 21:
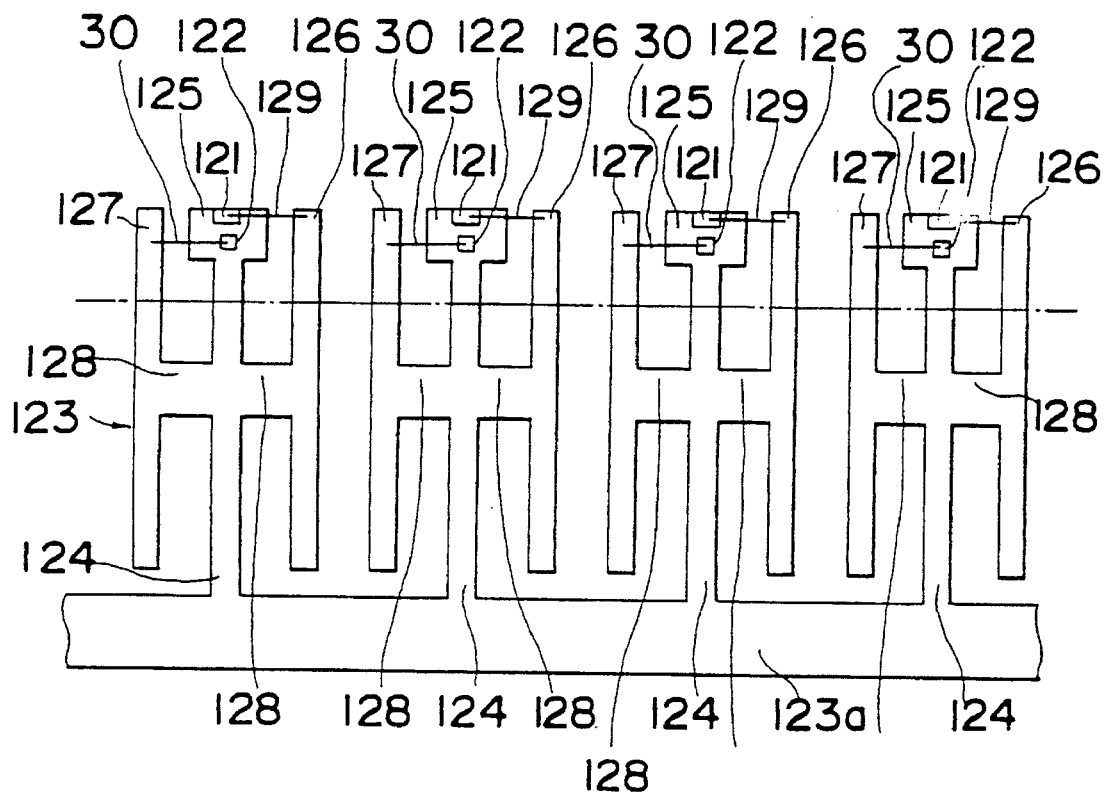
FIG. 21 is a plan view of the lead frame used to manufacture the semiconductor laser device of FIG. 19.

During the manufacture of the semiconductor laser devices, pairs of the upper and lower casing components 132 and 133 are positioned from above and below relative to the respective sets of the leads 124, 126 and 127 with the semicircular end walls 132a and 133a aligned with the phantom line L—L shown in FIG. 21 and the upper and lower casing components 132 and 133 of each pair are subsequently bonded together so as to enclose the associated chip mount 125. The bonding of the upper and lower casing components 132 and 133 to complete the cylindrical protective casing 131 may be carried out by the use of an adhesive agent or a fusion bonding technique.

After the mounting of the upper and lower casing components 132 and 133 in the manner described above to complete the cylindrical protective casings 131 one for each set of the leads 124, 126 and 127, the common leads 124 are separated by cutting from the tie bar 123a at respective portions of the leads 124, 126 and 127 inwardly with respect to the tie bar 123a, thereby completing the individual semiconductor laser devices each being of a structure wherein the semiconductor laser chip 121, the monitor photodiode 122 and the wires 129 and 130 are encased within the protective casing 131.

While in the prior art semiconductor laser device all of the semiconductor laser chip, the monitor photodiode chip and the wires are exposed bare and are not sufficiently protected, the semiconductor laser device according to the tenth embodiment of the present invention shown in FIGS. 19 to 22 is advantageous in that respective free end portions of the leads 124, 126 and 127 where the semiconductor laser chip, the monitor photodiode chip and the wires are provided are effectively protected by the cylindrical protective casing 131 of a generally cup-like configuration. Accordingly, all of the semiconductor laser chip 121, the monitor photodiode chip 122 and the wires 129 and 130 are not exposed outwardly and are sufficiently protected from external forces.

Also, since the semiconductor laser devices according to the tenth embodiment of the present invention are fabricated on the insert-type lead frame 123, the manufacture thereof can advantageously be simplified while making it possible to assembly each semiconductor laser device in a compact size and at a reduced cost.

Figure 23:
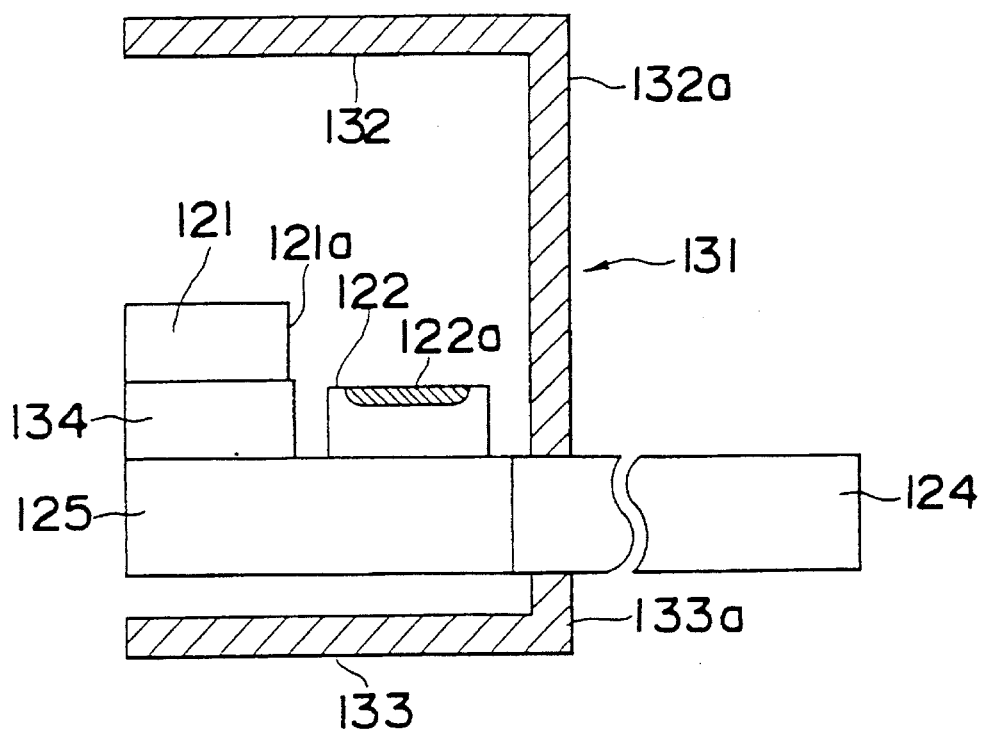
FIG. 23 as a schematic longitudinal sectional view of the semiconductor laser device according to an eleventh embodiment of the present invention.

The semiconductor laser device according to an eleventh preferred embodiment of the present invention which will now be described with reference to FIG. 23 is generally similar to that according to the tenth embodiment of the present invention and, therefore, in describing the eleventh embodiment of the present invention, parts shown in FIG. 23, but similar to those shown in FIGS. 19 to 22 are designated by like reference numerals used in FIGS. 19 to 22.

In the previously described tenth embodiment of the present invention, the monitor photodiode chip has been shown and described as positioned within the generally V-sectioned recess formed at the free end of each common lead of the lead frame. However, according to the eleventh embodiment of the present invention shown in FIG. 24, the free end of each common lead 124 is formed with a chip mount 125 on which the monitor photodiode 122 is mounted directly with its light receiving surface 122a oriented upwardly. On the other hand, the semiconductor laser chip 121 is mounted on a sub-mount 134 which is in turn mounted on the chip mount 125 at such a position that a laser beam emitted from the inwardly oriented beam emitting end face 121a of the semiconductor laser chip 121 can impinge upon the light receiving surface 122a of the monitor photodiode chip 122.

As is the case with the tenth embodiment of the present invention, all of the semiconductor laser chip 121, the monitor photodiode chip 122 and the wires (not shown) are encased within the cylindrical protective casing 131 and are not therefore exposed to the outside.

In the eleventh embodiment of the present invention shown in FIG. 23 the monitor photodiode chip is provided separate from the sub-mount. However, in the twelfth embodiment of the present invention shown in FIG. 24, the monitor photodiode chip is formed within a sub-mount 135 and is in turn so disposed that the inwardly oriented beam emitting end face 121a of the semiconductor laser chip 121 and the light receiving surface 135a of the monitor photodiode chip can assume respective positions similar to those in the eleventh embodiment of the present invention.

Figure 25:
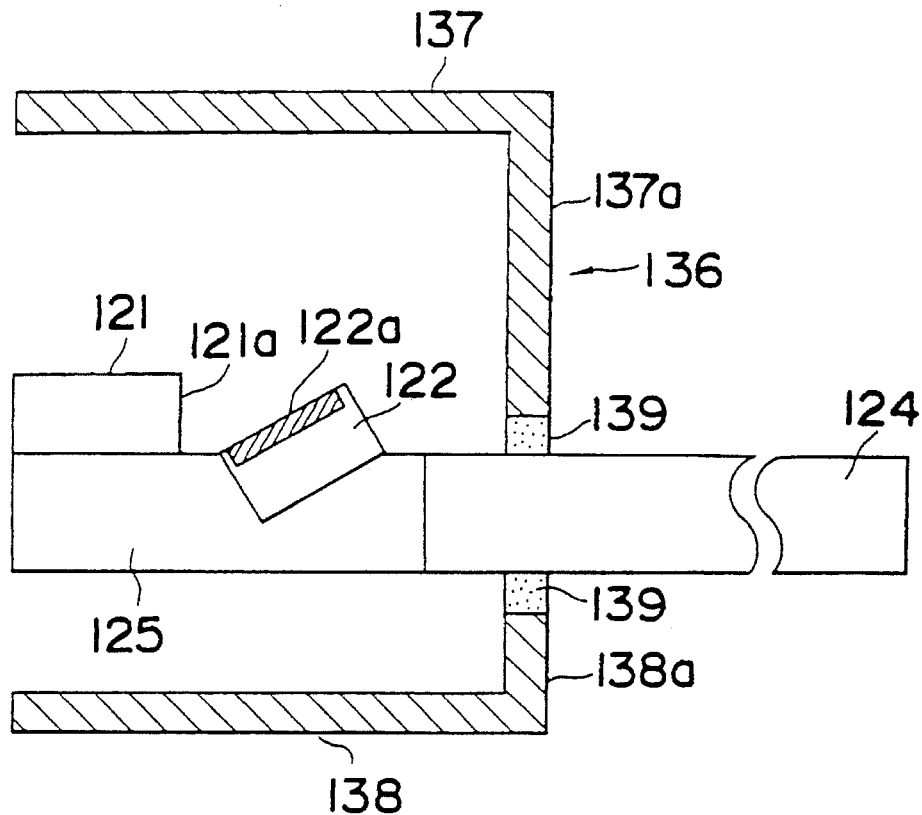
FIG. 25 is a schematic longitudinal sectional view of the semiconductor laser device according to a thirteenth embodiment of the present invention.

In the thirteenth embodiment of the present invention shown in FIG. 25, although a generally cylindrical protective casing 136 comprised of upper and lower casing components 137 and 138 shown therein is substantially similar to the protective casing 131 used in the tenth embodiment of the present invention shown in FIGS. 19 to 22, the protective casing 136 shown in FIG. 25 is made of metal in order for the protective casing 136 to have an increased strength with respect to the elevated temperature.

The use of metal as material for the protecting casing 136 poses a problem associated with thermal insulation between the common lead 124 and any one of end walls 137a and 138a of the respective upper and lower casing components 137 and 138. In view of this, according to the thirteenth embodiment shown in FIG. 25, thermally insulating material 139 such as, for example, glass having a low melting point are filled in respective holes, which are defined by the cutouts in each of the end walls 137a and 138a of the upper and lower casing components 137 and 178 when the latter are bonded together to complete the cylindrical protective casing 136, to thereby fill up a gap formed between each of the leads 124, 126 and 127 and the corresponding hole in the end wall of the cylindrical protective casing 136.

It is to be noted that the structure other than the protective casing 137 is substantially identical with that in the tenth embodiment of the present invention shown in FIGS. 19 to 22.

Figure 26:
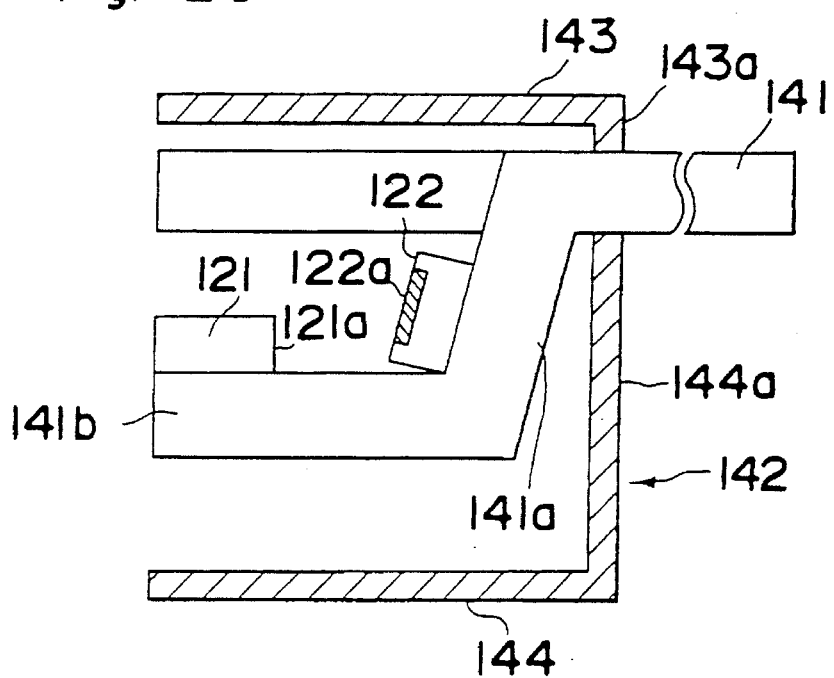
FIG. 26 is a schematic longitudinal sectional view of the semiconductor laser device according to a fourteenth embodiment of the present invention.

In the fourteenth embodiment of the present invention shown in FIG. 26, a cylindrical protective casing 142 shown therein is comprised of upper and lower casing components 143 and 144. Unlike the cylindrical protective casing 136 used in the thirteenth embodiment wherein the upper casing component 137 has a volume greater than that of the lower casing component 138, the cylindrical protective casing 142 employed in the fourteenth embodiment of the present invention is such that the upper casing component 143 has a volume smaller than that of the lower casing component 144 by the following reason.

As clearly shown in FIG. 26, in the fourteenth embodiment of the present invention, the free end portion of the common lead 141 is so shaped by the use of a forming technique as to incline downwardly at 141a and then to extend straight horizontally at 141b. Whereas the semiconductor laser chip 121 is mounted on the horizontally extending area 141b of the free end portion of the common lead 141, the monitor photodiode chip 122 is mounted on the inclined area 141a of the free end portion of the common lead 141 with its light receiving surface 122a facing towards the semiconductor laser chip 121. The use of the particular shape at the free end portion of the common lead 141 is advantageous in that the efficiency at which the laser beam emitted from the inwardly oriented beam emitting end face 121a of the semiconductor laser chip 121 is received by the monitor photodiode chip 22 can be increased.

In this way, the semiconductor laser chip 121 and the monitor photodiode chip 122 both positioned at a level lower than the remaining portion of the common lead 141 are substantially enclosed by the lower casing component 144 having a relatively great volume while the upper casing component 143 is used as a lid for closing an upper opening of the lower casing component 144, thereby permitting the semiconductor laser chip, the monitor diode and the wires to be assuredly protected from external forces.

Figure 27:
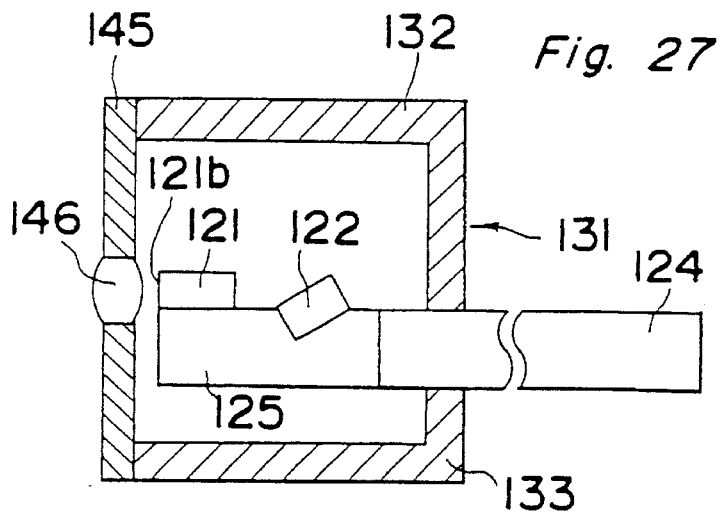
FIG. 27 is a schematic longitudinal sectional view of the semiconductor laser device according to a fifteenth embodiment of the present invention.

In a fifteenth preferred embodiment of the present invention shown in FIG. 27, the structure of the protective casing 131 and the attachment of the semiconductor laser chip 121, the monitor photodiode chip 122 and the protective casing 131 to the common lead 124 are substantially identical with those employed in the tenth embodiment of the present invention as shown in FIGS. 19 to 22.

However, the opening of the cylindrical protective casing 131 is closed by a lid 145 having an optical lens 146 affixed to a portion of said lid 145 aligned with the outwardly oriented beam emitting end face 121b of the semiconductor laser chip 121. This design shown in FIG. 27 is particularly advantageous in that the laser beam emitted from the outwardly oriented beam emitting end face 121b of the semiconductor laser chip 121 can be focused by the optical lens 146 to provide the laser beam of a high density of energies out of the cylindrical protective casing 131.

Figure 28:
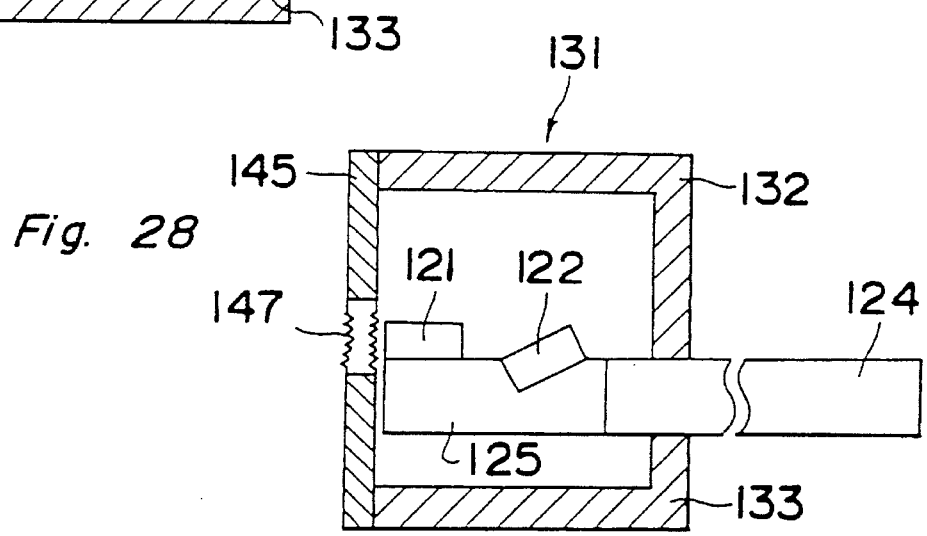
FIG. 28 is a schematic longitudinal sectional view of the semiconductor laser device according to a sixteenth embodiment of the present invention.

In a sixteenth embodiment of the present invention shown in FIG. 28, instead of the optical lens 146 employed in the fifteenth embodiment shown in FIG. 27, a holographic glass element 147 is fitted to that portion of the lid 145 which is aligned with the outwardly oriented beam emitting end face 121b of the semiconductor laser chip 121. With the use of the holographic glass element 147, the assembly can be formed into a hologram laser unit.

It is to be noted that the structure of the protective casing 131 and the attachment of the semiconductor laser chip 121, the monitor photodiode chip 122 and the protective casing 131 to the common lead 124, both employed in the practice of the sixteenth embodiment of the present invention, are substantially identical with those shown in FIGS. 19 to 22.

Figure 29:
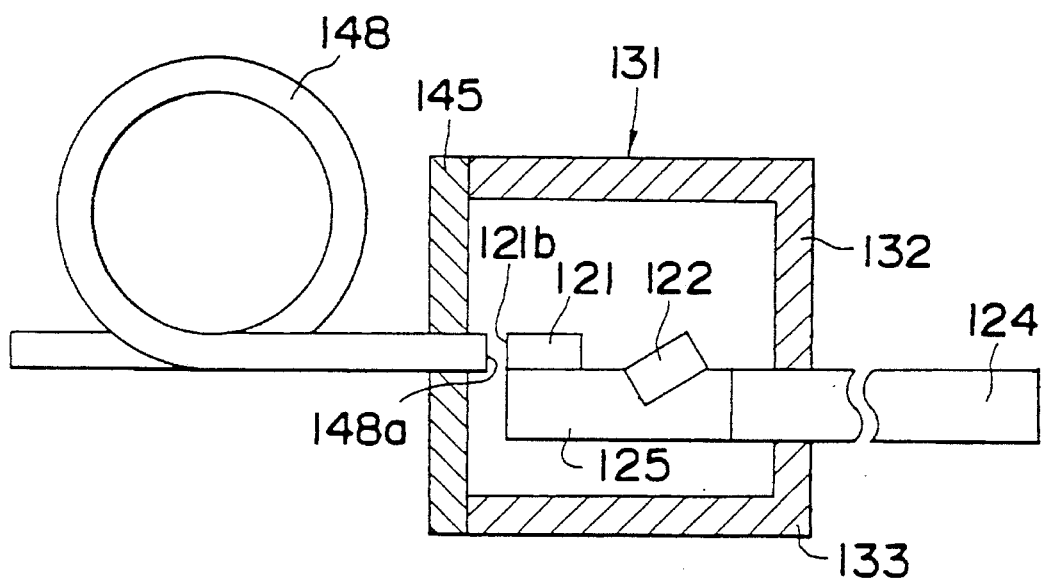
FIG. 29 is a schematic longitudinal sectional view of the semiconductor laser device according to a seventeenth embodiment of the present invention.

In a seventeenth preferred embodiment of the present invention shown in FIG. 29, the use is made of an optical fiber 148 for taking the laser beam out of the cylindrical protective casing 131. As shown therein, one end of the optical fiber 148 is inserted fixedly through the lid 145 so that an end face 148a of the optical fiber 148 confronts the outwardly oriented beam emitting end face 121b of the semiconductor laser chip 121. The use of the optical fiber 148 is particularly advantageous in that the laser beam emitted from the outwardly oriented beam emitting end face 121b of the semiconductor laser chip 121 can be guided in any desired direction outwardly of the protective casing 131.

It is to be noted that the structure of the protective casing 131 and the attachment of the semiconductor laser chip 121, the monitor photodiode chip 122 and the protective casing 131 to the common lead 124, both employed in the practice of the seventeenth embodiment of the present invention, are substantially identical with those shown in FIGS. 19 to 22.

FIGS. 30(a) to 30(f) illustrate sequential steps of manufacture of the semiconductor laser devices according to an eighteenth preferred embodiment of the present invention. The method shown in FIGS. 30(a) to 30(f) is so designed and so practiced that generally cylindrical protective casings each used to enclose the semiconductor laser chip, the monitor photodiode and the wires for a single semiconductor laser device is framed integrally so as to facilitate the amounting of the respective cylindrical protective casing onto the lead frame.

Figure 30A:
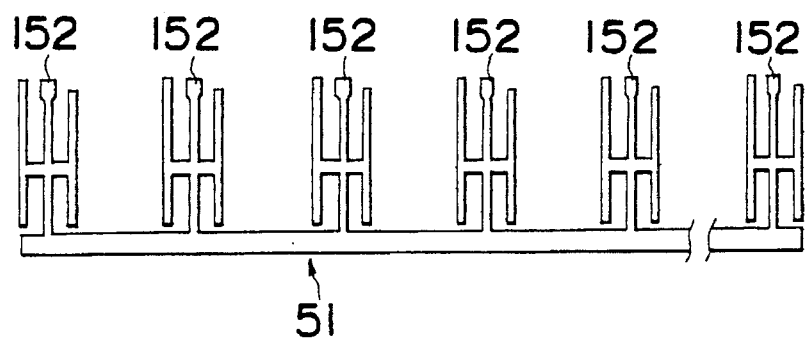
FIGS. 30(a) to 30(f) illustrate the sequence of manufacture of the semiconductor laser device according to an eighteenth embodiment of the present invention.
Figure 30B:
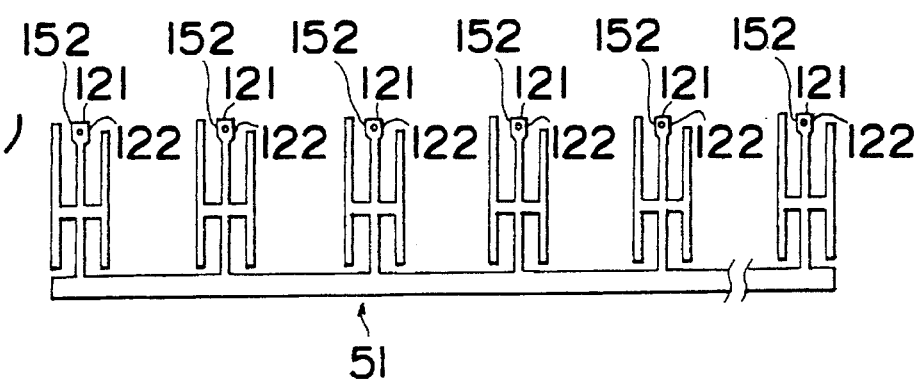

As shown in FIG. 30(b), the use is made of a lead frame 151 of such a shape as shown in FIG. 30(a) having common leads 152, and the semiconductor laser chip 121 is mounted on a free end or tip of each of the common leads 152, followed by a mounting of the monitor photodiode chip 122 at a position inwardly of the semiconductor laser chip 121. The manner in which the semiconductor laser chip 121 and the monitor photodiode chip 22 are mounted on the respective common lead 152 may be similar to that shown in any one of FIGS. 20, 23, 24 and 26, although in the eighteenth embodiment they are assumed as mounted in the manner as shown in FIG. 20.

Figure 30C:
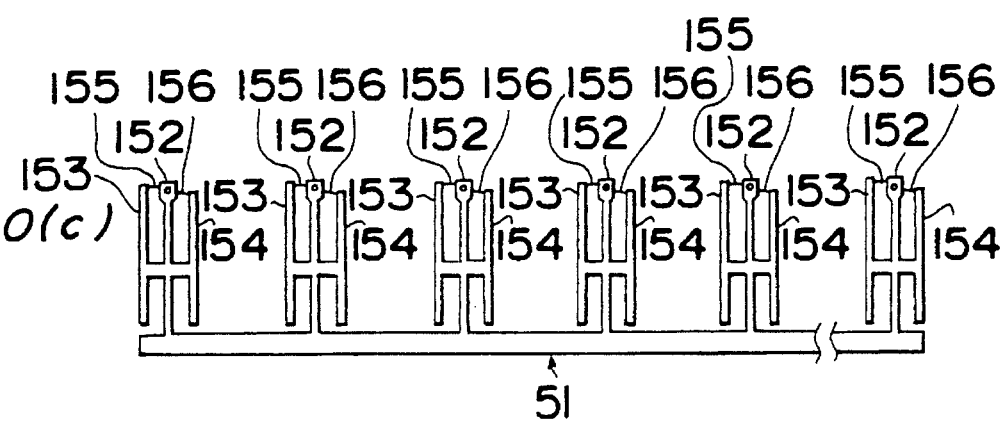

Then, as shown in FIG. 30(c), the semiconductor laser chip 121 (this reference numeral being not used in FIG. 30(c)) on each common lead 152 is electrically connected with a lead 153 on one side of the common lead 152 by means of an Au wire 155 and, similarly, the monitor photodiode chip 122 (this reference numeral being not used in FIG. 30(c)) on each common lead 152 is electrically connected with a lead 154 on the other side of the common lead 152.

Figure 30D:
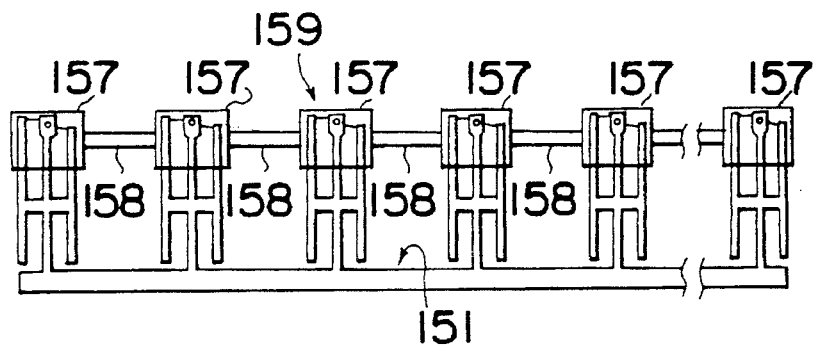
Figure 30E:
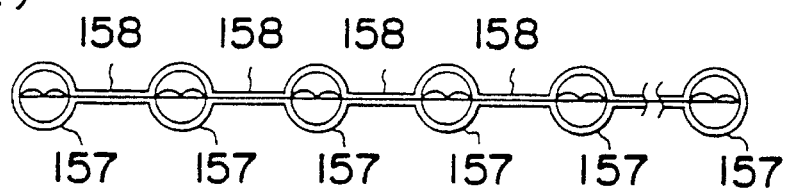
Figure 30F:
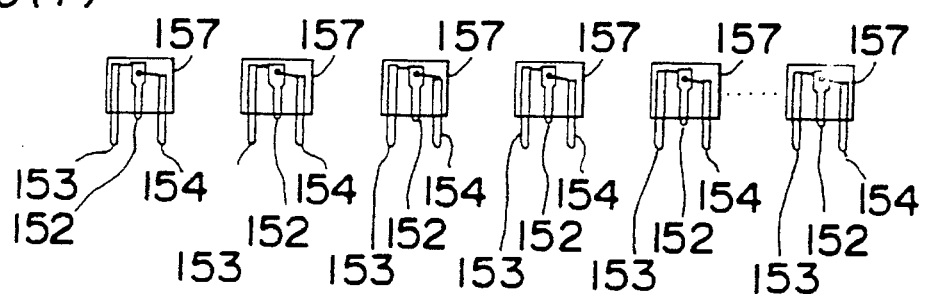

Thereafter, as shown in FIG. 30(d), preparation is made of a protective casing frame 159 in which a plurality of protective members 157 connected in series with each other by means of discrete connecting rods 158, each of said protective members 157 being of such a shape as will be described later. Respective assemblies each including the juxtaposed leads 152, 153 and 154 are inserted into the respective protective members 157 with the chips 121 and 122 on each common lead 152 positioned inside the associated protective member 157 together with the wires 155 and 156.

After the insertion of the assemblies into the protective members 157 as shown in FIG. 30(d), the connecting rods 158 of the protective casing frame 159 and the leads 152, 153 and 156 of the lead frame 151 are cut to separate the assemblies individually to thereby provide the individual semiconductor laser devices each being of a construction shown in FIG. 20.

Figure 31:
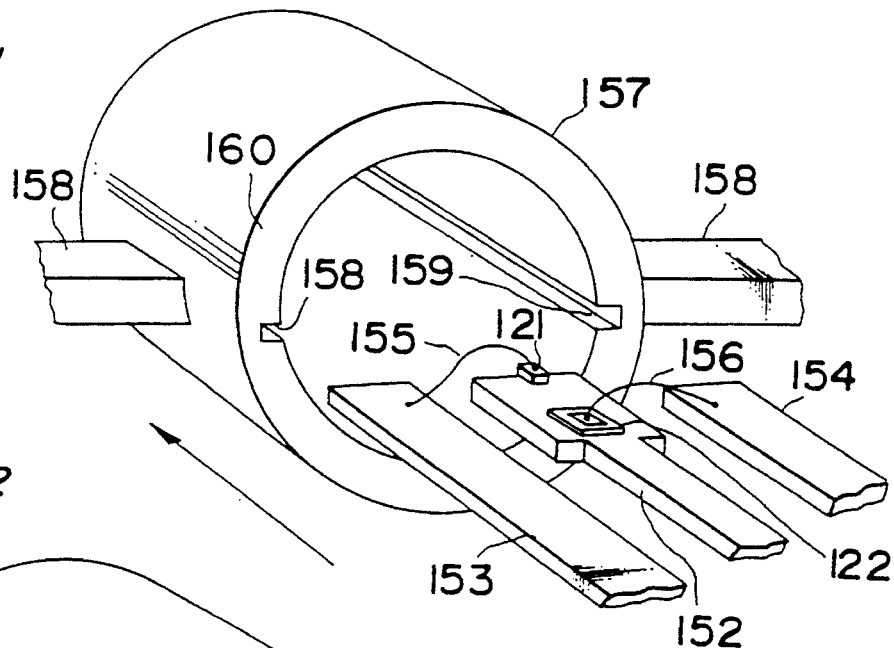
FIGS. 31 and 32 are schematic perspective views showing the structure of a retaining member and the manner in which the lead frame is fitted to a protective member frame.
Figure 32:
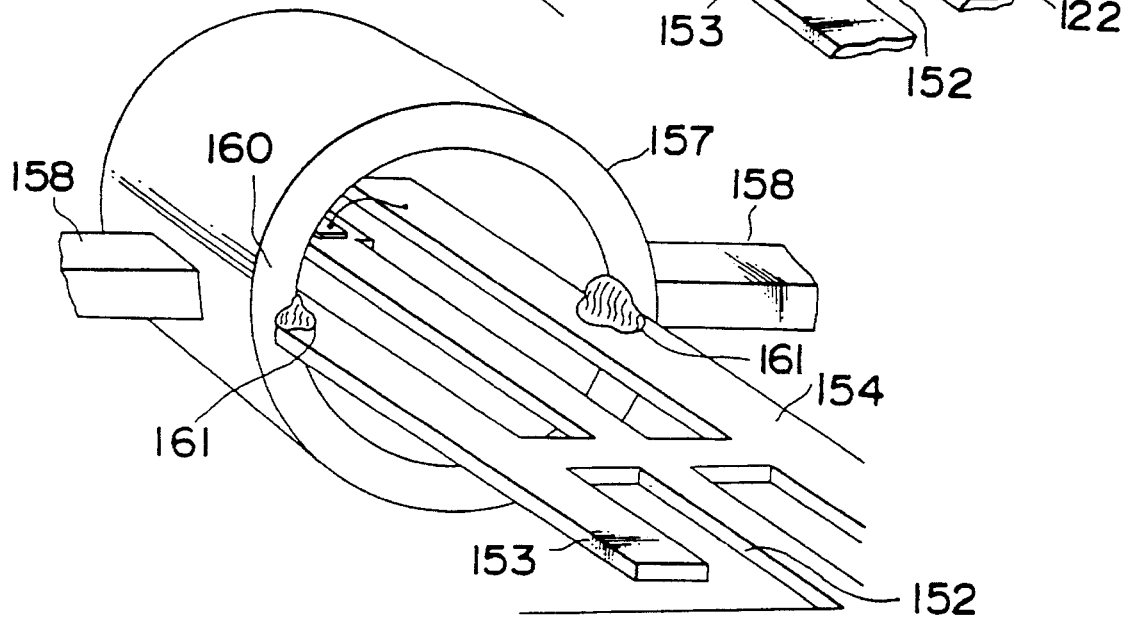

Each of the protective members 157 of the protective casing frame 159 referred to above is of such a shape as shown in FIGS. 31 and 32. Each protective member 157 is in the form of a generally cylindrical casing having an inner peripheral surface formed with circumferentially spaced axial grooves 158 and 159 for slidingly receiving the leads 153 and 154 as the respective assembly including the leads 152, 153 and 154 with the chips 121 and 122 mounted on the common lead 152 is inserted into such cylindrical protective casing 157.

In order to secure each assembly in position within the respective cylindrical protective casing 157, after the assembly has been inserted into the cylindrical protective casing 157 with the leads 153 and 154 received in the circumferentially spaced axial grooves 158 and 159 in the inner peripheral wall surface of the cylindrical protective casing 157, a bonding resin is deposited at respective portions of an annular end face 160 of the cylindrical protective casing 157 where the leads 153 and 154 are securely connected to the protective casing 157 by means of the resin deposits 161 and 161 as best shown in FIG. 32.

It is to be noted that, if each of the axial grooves 158 and 159 is chosen to have a length sufficient to allow the associated cylindrical protective casing 157 to completely enclose all of the semiconductor laser chip 121, the monitor photodiode 122 and the wires 155 and 156, they can be effectively and satisfactorily be protected.

Figure 33:
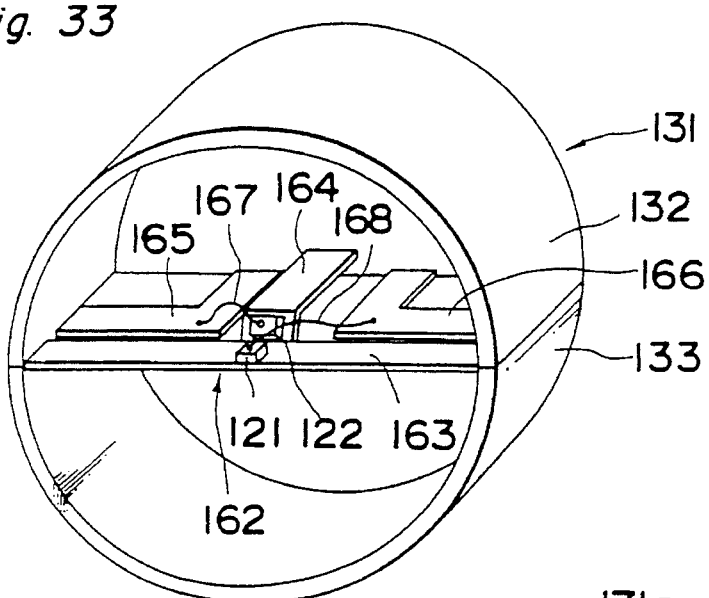
FIG. 33 is a perspective view showing the semiconductor laser device according to a nineteenth embodiment of the present invention.

A nineteenth preferred embodiment of the present invention is shown in FIG. 33. In this embodiment, the protective casing employed therein is identical with the protective casing 131 shown in FIGS. 19 to 22.

As shown in FIG. 33, the tip of the common lead 162 enclosed in the protective casing 131 represents a generally T shape including transverse and axial bars 163 and 164 corresponding in position to transverse and vertical arms of the shape of a figure "T", respectively. The semiconductor laser chip 121 is mounted on an intermediate portion of the transverse bar 163 of the common lead 162. A portion of the axial bar 164 of the common lead 162 adjacent the transverse bar 163 is bent so as to incline downwardly to provide an inclined mount area where the monitor photodiode chip 122 is mounted so as to confront the semiconductor laser chip 121. The semiconductor laser chip 121 mounted on the intermediate portion of the transverse bar 163 of the common lead 162 is electrically connected with the lead 166 by means of the wire 168 while the monitor photodiode chip 122 mounted on the inclined mount area of the axial bar 164 of the common lead 162 is electrically connected with the lead 165 by means of the wire 167.

It is to be noted that, in the nineteenth embodiment of the present invention the transverse bar 163 of the common lead 162 has a length greater than the inner diameter of the cylindrical protective casing 131 and the common lead 162 is securely sandwiched between the upper and lower casing components 132 and 133 of the cylindrical protective casing 131.

Also, in the nineteenth embodiment of the present invention, each of the leads 165 and 166 has its free end portion bent to represent a shape similar to the shape of a figure "L" with its free extremity being sandwiched between the upper and lower casing components 132 and 133 of the cylindrical protective casing 131 as is the case with the common lead 162.

Thus, according to the nineteenth embodiment of the present invention, the protective casing 131 is fixed to the leads 162, 165 and 166 at lateral sides and a bottom portion of each of the upper and lower casing components 132 and 133 and, accordingly, the cylindrical protective casing 131 can be secured fixed in position. It is to be noted that, in the description of the nineteenth embodiment of the present invention, the monitor photodiode chip 122 has been mounted on the inclined mount area of the axial bar 164 of the common lead 162 so that the laser beam from the semiconductor laser chip 121 can effectively impinge upon the monitor photodiode chip 122. However, the present invention is not always limited thereto and the semiconductor laser chip 121 may be mounted on the common lead 162 through a sub-mount, in a manner similar to FIG. 23, while the axial bar of the common lead is made straight, i.e., without the common lead being bent to provide the axial bar.

Figure 34:
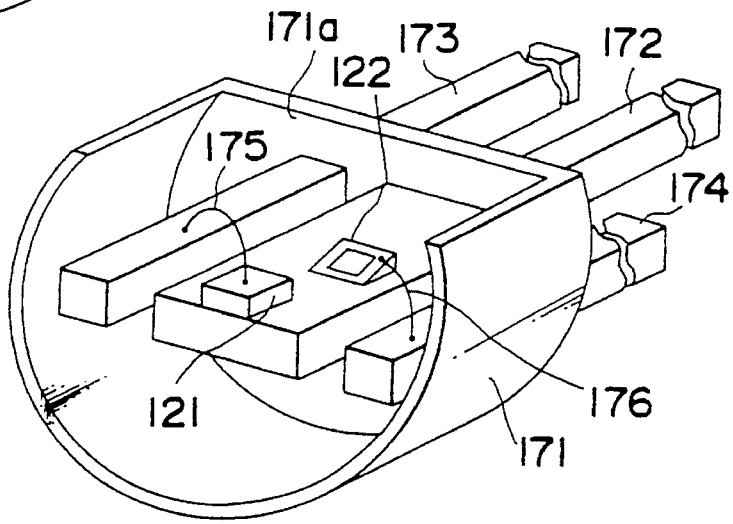
FIG. 34 is a perspective view of the semiconductor laser device according to a twentieth embodiment of the present invention.

FIG. 34 illustrates in a perspective view the semiconductor laser device according to a twentieth preferred embodiment of the present invention. A protective casing 171 employed in this embodiment is of a shape corresponding to a generally cylindrical barrel having one end closed, but having a portion cut along a line parallel to the longitudinal axis thereof. More specifically, the protective casing 171 includes a U shaped body and an end wall 171a and is integrally molded together with leads 172, 173 and 174. These leads 172, 173 and 174 are formed so as to protrude outwardly from opposite surfaces of the end wall 171a in a direction perpendicular to such end wall 171a. The semiconductor laser chip 121 is mounted on a tip of the lead 172 situated within the body of the protective casing 171 while the monitor photodiode chip 122 is mounted on the lead 172 at a location axially inwardly of the semiconductor laser chip 121 in an inclined fashion to allow the light receiving surface thereof to confront the semiconductor laser chip 121.

The semiconductor laser chip 121 is electrically connected with the lead 173 by means of a wire 175 while the monitor photodiode chip 122 is electrically connected with the lead 174 through a wire 176. The twentieth embodiment of the present invention is particularly advantageous in that, since a lateral portion of the protective casing 171 on one side of the semiconductor laser chip 121 and facing a plane in which the leads 172, 173 and 174 are disposed is axially cut away, die-bonding and wire-bonding can be efficiently effected to the leads 172, 173 and 174 with a high workability.

Figure 35:
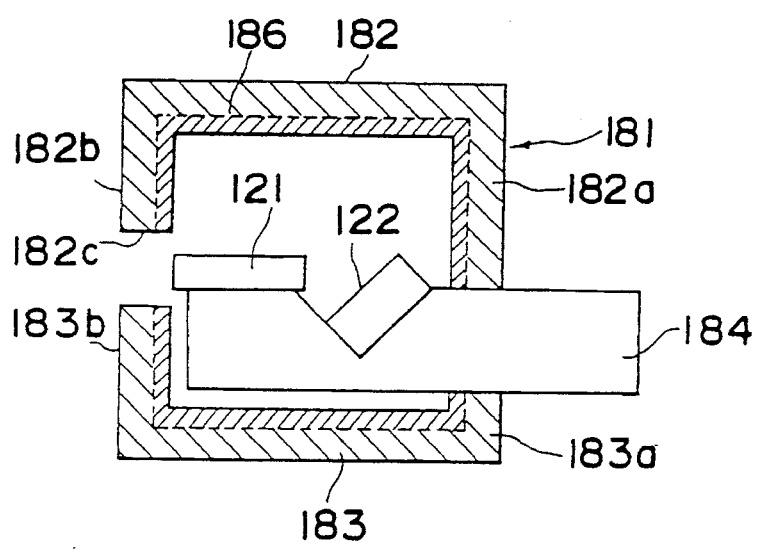
FIG. 35 is a schematic longitudinal sectional view of the semiconductor laser device according to a twenty-first embodiment of the present invention.

FIG. 35 illustrates in a side sectional view the semiconductor laser device according to a twenty-first preferred embodiment of the present invention. A protective casing 181 shown therein is in the form of a generally cylindrical protective casing having its opposite ends closed by respective end walls. This cylindrical protective casing 181 is separable into upper and lower casing components 182 and 183 as is the case with the cylindrical protective casing shown in FIGS. 19 to 22. A tip of a lead 184 securely sandwiched between respective end walls 182a and 182b of the upper and lower casing components 182 and 183 carries the semiconductor laser chip 121 mounted thereon, and the monitor photodiode chip 122 is also mounted on the lead 184 at a location adjacent to and axially inwardly from the semiconductor laser chip 121 in an inclined fashion to permit the light receiving surface of the monitor photodiode chip 122 to confront the semiconductor laser chip 121.

An intermediate portion of the joint between end walls 182b and 183b of the upper and lower casing components 182 and 183, that is, a central portion of one of the opposite end walls of the cylindrical protective casing 181 adjacent the semiconductor laser chip 121, is formed with a through-hole 182c for the passage of the laser beam from the semiconductor laser chip 121 outwardly of the cylindrical protective casing 181. Thus, other than a portion confronting the outwardly oriented beam emitting end face of the semiconductor laser chip 121, the cylindrical protective casing 181 completely encloses the component parts to minimize any possible influence brought about by external light.

Also, in the twenty-first embodiment shown in FIG. 35, an entire inner surface of the cylindrical protective casing 181 is coated with a light absorbing layer 186 so that a portion of the laser beam emitted from the inwardly oriented beam emitting end face of the semiconductor laser chip 121 nd/or external light entering interiorly through the through-hole 182c can be absorbed by the light absorbing layer 186.

According to the embodiment shown in FIG. 35, the intensity of the laser beam emitted from the outwardly oriented beam emitting end face of the semiconductor laser chip 121 can be controlled accurately. Also, even when the laser beam emitted from the inwardly oriented beam emitting end face of the semiconductor laser chip 121 is reflected by the surface of the monitor photodiode chip 122, the reflected beam can be absorbed by the light absorbing layer 186 and, therefore, any possible emission of the reflected beam out of the protective casing 181 can be avoided. Accordingly, no ripple occur in a far field pattern of the emitted laser beam.

Figure 36:
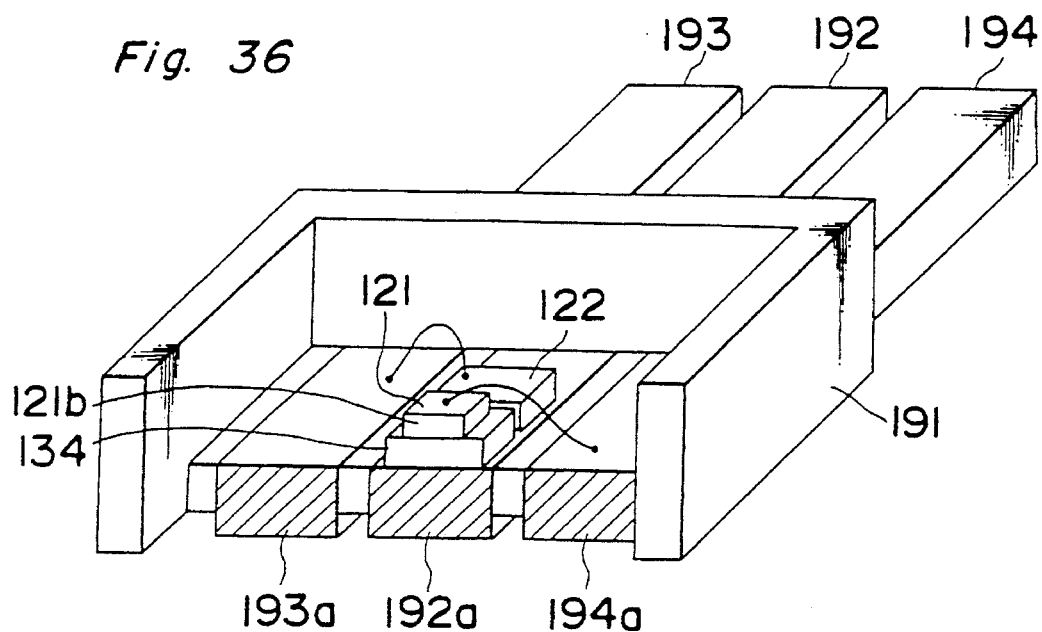
FIG. 36 is a schematic perspective view of the semiconductor laser device according to a twenty-second embodiment of the present invention.
Figure 37:
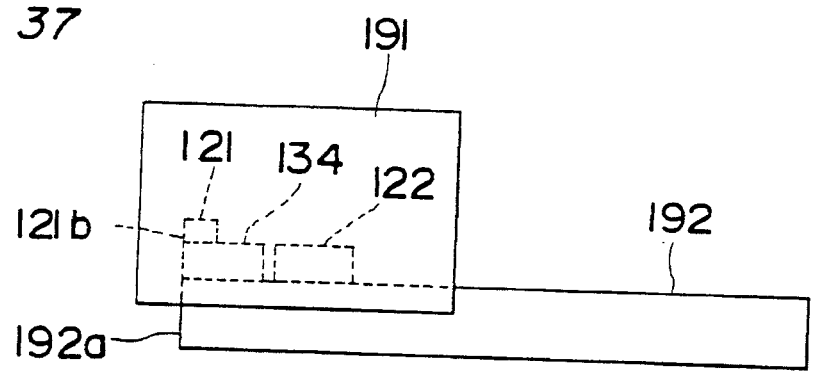
FIG. 37 is a side view of the semiconductor laser device shown in FIG. 36.

FIGS. 36 and 37 illustrate, in perspective and side views, respectively, the semiconductor laser device according to a twenty-second preferred embodiment of the present invention. A protective casing 191 employed in this embodiment is of a generally U-shaped configuration integrally molded with the leads 192, 193 and 194. The semiconductor laser chip 121 is mounted on a tip of the lead 192 through a sub-mount 134 while the monitor photodiode chip 122 is mounted on the lead 192 at a position inwardly of the semiconductor laser chip 121.

Respective end faces of the leads 192, 193 and 194 encompassed within the U-shaped protective casing 191 are formed with reference faces 192a, 193a and 194a lying on the same plane, and the semiconductor laser chip 121 is so mounted on the lead 192 with its outwardly oriented beam emitting end face 121b in flush with any one of the reference faces 192a, 193a and 194a.

The provision of the reference faces 192a, 193a and 194a at the respective end faces of the leads 192, 193 and 194 is effective to improve the accuracy with which the semiconductor laser device of the present invention is fitted to an external system. Also, the formation of the protective casing 191 so as to have a generally U-shaped cross-section is effective to preserve a balance among the attachment of the semiconductor laser chip 121 and others, the attachment of the semiconductor laser device to the external system and the productivity of the semiconductor laser chip 121.

Figure 38:
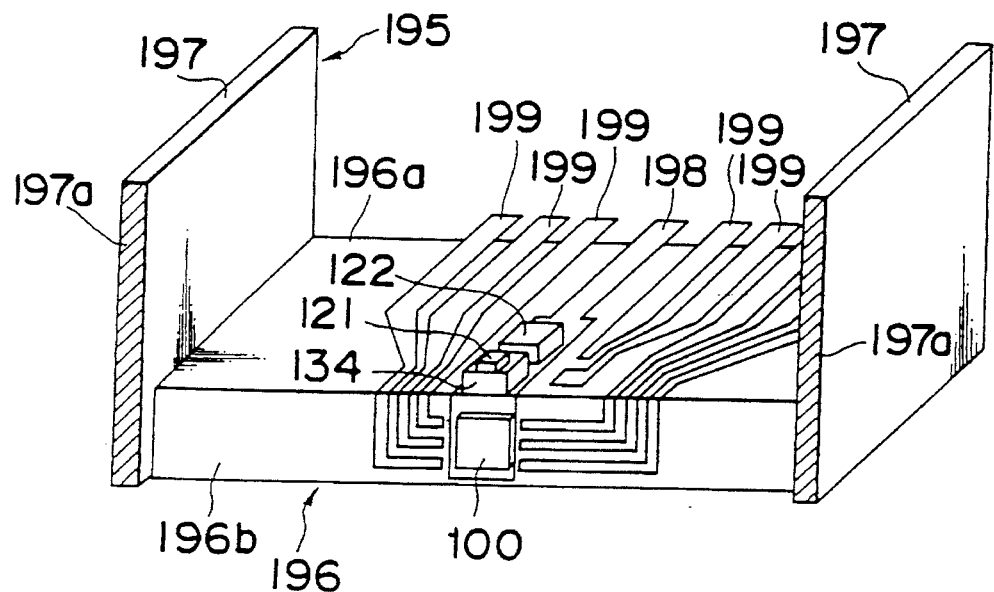
FIG. 38 is a perspective view of the semiconductor laser device according to a twenty-third embodiment of the present invention.
Figure 39:
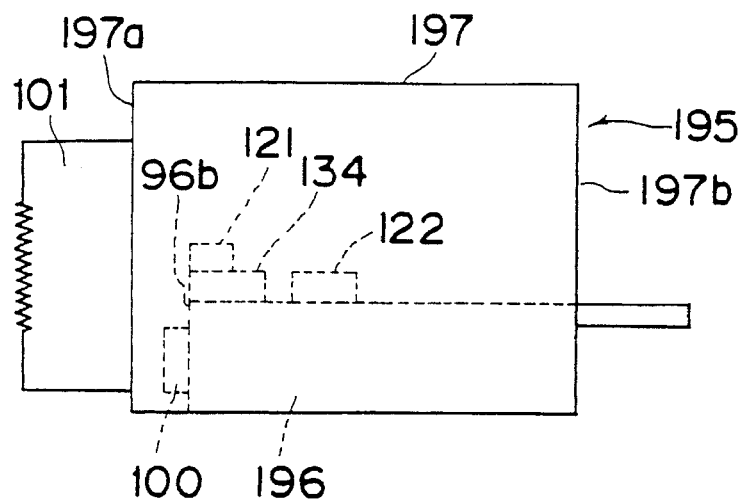
FIG. 39 is a side view of the semiconductor laser device shown in FIG. 38.

FIGS. 38 and 39 illustrate, in perspective and side views, respectively, the semiconductor laser device according to a twenty-third preferred embodiment of the present invention. A protective casing 195 employed in this embodiment is of a generally U-shaped configuration including a generally rectangular base 196 and a pair of side walls 197 and 197 perpendicular to the base 196. The base 196 has an inner surface 196a formed with a printed pattern of a lead 198 and a plurality of leads 199 by the use of a circuit printing technique. The lead 198 has a tip on which the semiconductor laser chip 121 is mounted through the sub-mount 122 and the monitor photodiode chip 122 is also mounted thereon at a location inwardly of the semiconductor laser chip 121. A detector photodiode chip 100 adapted to detect a light signal delivered by the laser beam from the semiconductor laser chip 21 and subsequently reflected is mounted on a side face 196b of the base 196.

The generally U-shaped protective casing 195 employed in this embodiment also has reference faces defined by respective end faces 197a and 197a of the side walls 197 and 197 adjacent the side face 196b where the detector photodiode chip 100 is mounted, but positioned at a level protruding a slight distance outwardly from the plane in which the side face 196b lies.

As best shown in FIG. 39, a holographic glass plate 101 is secured to the reference faces 197a and 197a of the protective casing 195 to provide a hologram laser unit. It is to be noted that the reference faces 197a and 197a may be defined by the opposite end faces 197b and 197b of the side walls 197 and 197 remote from the side face 196b where the detector photodiode chip 100 is mounted.

Figure 40:
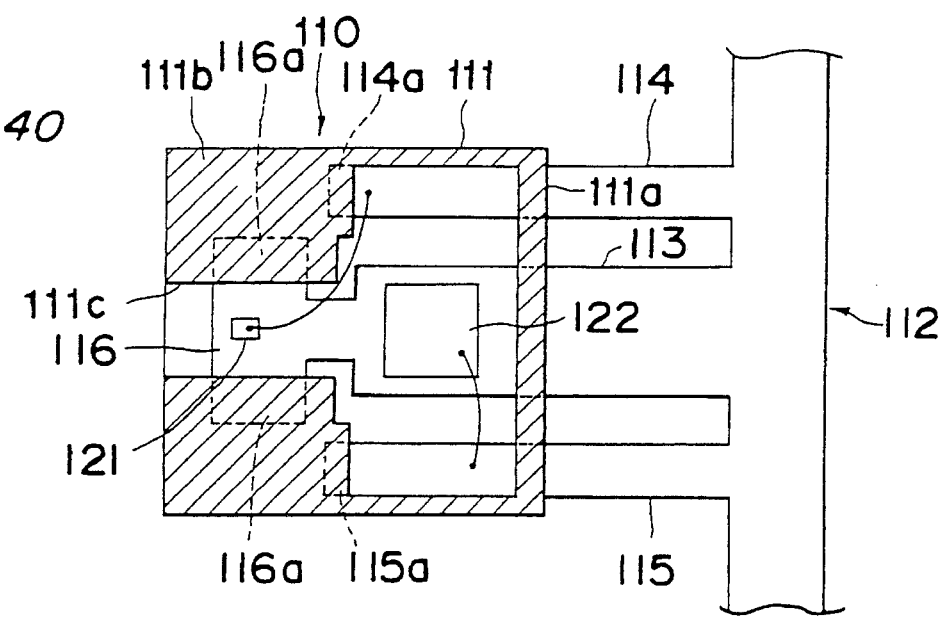
FIG. 40 is a transverse sectional view of the semiconductor laser device according to a twenty-fourth embodiment of the present invention.

FIG. 40 illustrates the semiconductor laser device according to a twenty-fourth preferred embodiment of the present invention. This embodiment relates to an improvement made in the protective casing 131 shown in FIGS. 19 to 22 and, more particularly, to the arrangement in which a protective casing 110 is held even by respective tips of leads 113, 114 and 115 of a lead frame 112.

Figure 24:
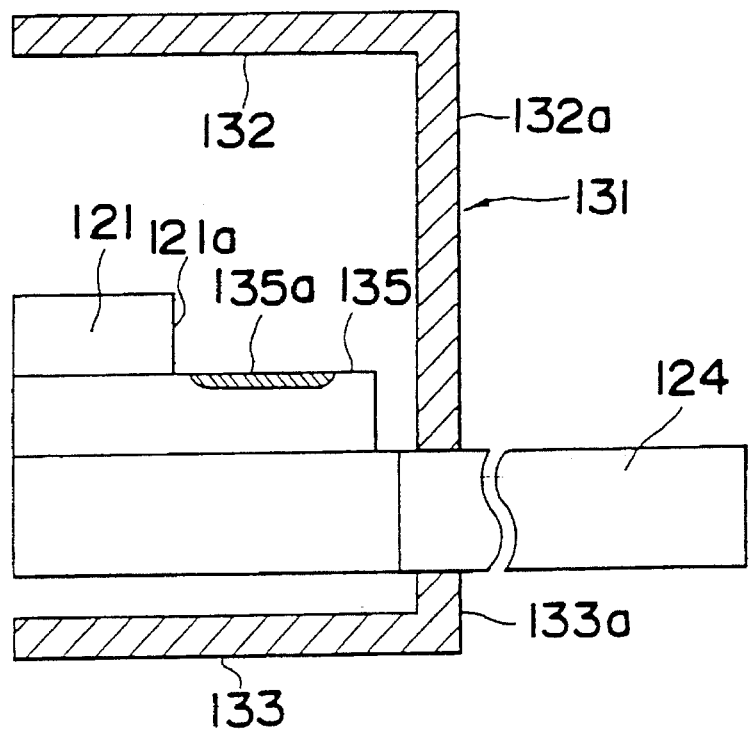
FIG. 24 as a schematic longitudinal sectional view of the semiconductor laser device according to a twelfth embodiment of the present invention.

The protective casing 110 employed in the embodiment of FIG. 24 is separable into an upper casing component 111 and a lower casing component as is the case with the protective casing 131 shown in FIGS. 19 to 22, and the upper casing component 111 is fixed in position by causing a bottom portion 111a of the upper casing component 111 and a bottom portion of the lower casing component to hold the leads 113, 114 and 115. It is to be noted that in FIG. 40 only the upper casing component 111 is shown in section.

The semiconductor laser chip 121 is mounted on a chip mount 116 defined on the lead 113 while the monitor photodiode chip 122 is mounted on the lead 113 at a position inwardly of the chip mount 116.

Also, according to the twenty-fourth embodiment of the present invention, a lid 111b having a hole 111c defined therein is integrally formed with the protective casing 110 at a location opposite to the bottom portion 111a. This lid 111b has a substantial thickness, and respective tip portions 114a and 115b of the leads 114 and 115 and opposite sides 116a and 116a of the chip mount 116 on the lead 112 are securely sandwiched between mating faces of the lid 111b of the upper casing component 111 and a similar lid (not shown in FIG. 40) of the lower casing component when the upper and lower casing components are joined together to provide the complete protective casing 110. In this way, by means of the lid 111b and the bottom portion 111a the protective casing 110 is secured to the leads 113, 114 and 115. Accordingly, according to this embodiment shown in FIG. 40, the fixing of the hollow protective casing 110 can be made securely.

Where the semiconductor laser device according to any one of the foregoing embodiments is used as a light source in the optical disc recording and/or reproducing system, and when all of the semiconductor laser chip, the monitor photodiode chip and the wires are to be encased by the resin layer, it is preferred that that portion of the resin layer aligned with the outwardly oriented beam emitting end face of the semiconductor laser chip has a resin thickness of not greater than 500 µm and, at the same time, lies parallel to the outwardly oriented beam emitting end face of the semiconductor laser chip. This is because, when the semiconductor laser device is to be used as the light source in the optical disc recording and/or reproducing system, any possible deviation of the optical axis due to the presence of the resin layer covering the outwardly oriented beam emitting end face and any possible multiplex reflection of light between the outwardly oriented beam emitting end face and the surface of the resin layer may bring about problems.

FIG. 11 illustrate a laser emission characteristic exhibited by the semiconductor laser device which the outwardly oriented beam emitting end face of the laser diode chip is covered by the resin layer lying parallel thereto and having a resin thickness not greater than 500 µm. As can be seen from the laser emission characteristic shown in FIG. 11, since the outwardly oriented beam emitting end face of the semiconductor laser chip is covered by the resin layer of 500 µm in resin thickness and made of a single synthetic resin, both of a curve $\theta_\parallel$ representing a pattern of distribution of the laser beam in a horizontal direction relative to an active layer in which a laser oscillation takes place and a curve $\theta_\perp$ representing that in a vertical direction relative to the active layer exhibits a single peak.

Also, since that portion of the resin layer aligned with the outwardly oriented beam emitting end face of the semiconductor laser chip lies parallel to such outwardly oriented beam emitting end face, both of the curves shown in the graph of FIG. 11 exhibit no deviation of the optical axis.

Thus, according to any one of the foregoing embodiments, the present invention has made it possible to provide the semiconductor laser device which can be effectively used as a light source in an optical disc recording and/or reproducing system to the best advantage.

It is to be noted that, in the practice of any one of the foregoing embodiments of the present invention, the resin thickness of the resin layer suffices to be not greater than 500 µm. Even when the resin thickness is chosen to be 400, 300, 200 or 100 µm, the resultant semiconductor laser device can exhibit satisfactory characteristics. However, if the resin thickness is too small, corrosion may occur at the outwardly oriented beam emitting end face of the semiconductor laser chip under the influence of ambient humidity and this may lead to a considerable variation in electric operating current of the laser device and, therefore, the minimum allowable resin thickness is preferably 10 μm.

From the foregoing description, it has now become clear that, according to one aspect of the present invention, since the protective casing fitted integrally to the stem where the semiconductor laser chip and the monitor photodiode chip are mounted and covered by the resin layer encloses to protect at least the semiconductor laser chip, the monitor photodiode chip, the first wire electrically connected with the semiconductor laser chip and the second wire electrically connected with the monitor photodiode chip, the semiconductor laser chip, the monitor photodiode chip and the wires can be effectively protected from external forces. Accordingly, the handling of the semiconductor laser device as well as the manufacturing process becomes easy.

Also, according to another aspect of the present invention, since the stem is constituted by one of leads of a lead frame and the protective casing is employed in the form of a generally cylindrical casing closed at one end thereof with the lead extending through the end wall of the cylindrical casing, the semiconductor laser chip and the monitor photodiode chip enclosed within the cylindrical casing can be formed on the lead frame, rendering the process of making the semiconductor laser device to be simplified and, at the same time, making it possible to manufacture the semiconductor laser device in a compact size at a reduced cost.

Again, according to a further aspect of the present invention, the stem, a first conductor and a second conductor are constituted by respective leads of the lead frame, and the protective casing is employed in the form of a generally cylindrical casing closed at one end having an inner peripheral surface formed with circumferentially spaced grooves such that outermost two of the leads can be received in the respective grooves to secure the leads integrally to the protective casing. Therefore, when the protective casing is to be mounted around the leads, it can readily be accomplished by utilizing the grooves as guides along which the leads are guided during the insertion of the leads into the protective casing. According to the present invention, therefore, by utilizing the protective casings connected together by means of connecting bars to provide a frame of protective casings, the protective casings so framed can easily be mounted around a plurality of sets of the leads, thereby increasing the productivity.

Furthermore, according to a yet aspect of the present invention, the protective casing is of a sealed structure except for a hole defined therein for the passage of the laser beam emitted from the outwardly oriented beam emitting end face of the semiconductor laser chip and has its interior surface coated with the light absorbing layer. Accordingly, not only can external light entering into the protective casing be effectively shielded, but portion of the laser beam which has failed to exit out of the protective casing and a slight amount of light intruding through the hole can be absorbed by the light absorbing layer. Therefore, not only can the handling be easy, but any possible influence brought about by the external light can be minimized to accomplish an accurate control of the intensity of the laser beam emitted from the semiconductor laser chip to the outside of the protective casing.

In addition, the use of the optical member at a portion of the protective casing where the laser beam emitted from the semiconductor laser chip passes towards the outside of the protective casing makes it possible not only to be easy in handling, but also to enable the laser beam to be taken out according to characteristics of the optical member.

Yet, the protective casing is provided with reference faces which define a reference plane utilized at the time the stem carrying the semiconductor laser chip mounted thereon is to be installed in a different equipments. Therefore, the semiconductor laser device according to the present invention can easily be installed in the external equipments. At this time, the reference plane defined in the protective casing provides a reference position at which the stem should be positioned relative to the equipment. Accordingly, not only can the handling be easy, but also the position in the equipment on which the laser beam emitted from the semiconductor laser chip can impinge can be accurately defined.

Figure 41:
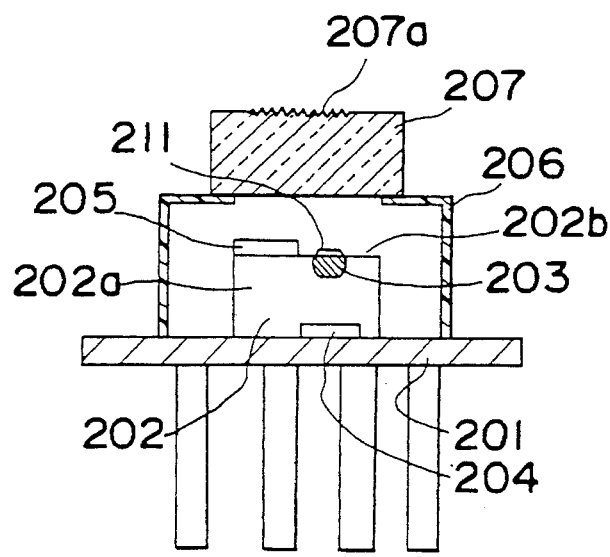
FIG. 41 is a schematic sectional view of the semiconductor laser device according to a twenty-fifth embodiment of the present invention.

Referring now to FIG. 41 showing a twenty-fifth preferred embodiment of the present invention, reference numeral 201 represents a stem base; reference numeral 202 represents a stem fixedly mounted on the base 201; reference numeral 203 represents a semiconductor laser chip mounted on a side face 202a of the stem 202; reference numeral 204 represents a monitor photodiode chip mounted on the side face 202a of the stem 202; and reference numeral 205 represents a detector photodiode mounted on a top face 202b of the stem 202.

The semiconductor laser chip 203 and a portion of the side face 202a of the stem 202 around the semiconductor laser chip 203 are covered by a transparent resin layer 211 which may be made of, for example, silicone. Surface areas of the transparent resin layer 211 which confronts the monitor photodiode chip 204 and faces in a direction opposite to the monitor photodiode chip 204, respectively, are rendered to be parallel to each other since, if these surface areas fails to be parallel to each other, the optical axis may deviate under the influence of a lens effect. Portions of the resin layer 211 aligned with the parallel surface areas have a thickness not greater than 500 μm. If the resin thickness of each of those portions of the resin layer 211 is too excessive, the beam emission characteristic may be disturbed by the effect of a multiplex reflection of light between the beam emitting end face of the semiconductor laser chip 203 and the surface of the transparent resin layer 211 to such an extent that the semiconductor laser device can no longer useable as a light source in the optical disc recording and/or reproducing system. Hereinafter, one example of the laser emission characteristic exhibited by the semiconductor laser device which the beam emitting end face of the laser diode chip is covered by the resin layer lying parallel thereto and having a resin thickness not greater than 500 μm will be discussed.

As can be understood from FIG. 11, since the beam emitting end face of the semiconductor laser chip 203 is covered by the resin layer of 500 μm in resin thickness and made of a single synthetic resin, both of a curve θ∥ representing a pattern of distribution of the laser beam in a horizontal direction relative to an active layer in which a laser oscillation takes place and a curve θ⊥ representing that in a vertical direction relative to the active layer exhibits a single peak.

Also, since that portion of the resin layer aligned with the outwardly oriented beam emitting end face of the semiconductor laser chip lies parallel to such outwardly oriented beam emitting end face, both of the curves shown in the graph of FIG. 11 exhibit no deviation of the optical axis.

In other words, according to the structure shown in FIG. 41, it is possible to provide the semiconductor laser device which can be effectively used as a light source in an optical disc recording and/or reproducing system to the best advantage.

It is to be noted that, in the practice of the present invention, the resin thickness of the resin layer suffices to be not greater than 500 µm. Even when the resin thickness is chosen to be 400, 300, 200 or 100 µm, the resultant semiconductor laser device can exhibit satisfactory characteristics. However, if the resin thickness is too small, corrosion may occur at the outwardly oriented beam emitting end face of the semiconductor laser chip under the influence of ambient humidity and this may lead to a considerable variation in electric operating current of the laser device and, therefore, the minimum allowable resin thickness is preferably 10 µm.

A cap 206 made of plastics is mounted fixedly on the base 201 so as to enclose all of the stem 202, the semiconductor laser chip 203 and the photodiode chips 204 and 205. This plastics cap 206 has an end wall formed with a hole 206a in alignment with the step 202, and a glass block 207 is fixedly mounted on the end wall of the cap 206 so as to cover the hole 206a. A portion of the glass block 207 opposite to the hole 206a is formed with a hologram 207a. The plastics cap 206 merely serves to provide a support for the glass block 207 and no windowpane is needed.

The semiconductor laser device of the above described construction operates in the following manner. The semiconductor laser chip 203 emits a first laser beams towards the monitor photodiode chip 204 and, also, a second laser beam towards the glass block 207. Based on the electric current proportional to the amount of light received by the monitor photodiode chip 204, the intensity of the first laser beam emitted from the semiconductor laser chip 203 is controlled to a predetermined value. The intensity of the second laser beam emitted from the semiconductor laser chip 203 is substantially proportional to that of the first laser beam and is therefore controlled indirectly by controlling the intensity of the first laser beam. On the other hand, the second laser beam emitted from the semiconductor laser chip 203 emerges outwardly of the cap 206 passes through the glass block 207 towards an optical disc (not shown) and is subsequently reflected from the optical disc so as to be incident on the hologram 207a. The reflected laser beam incident on the hologram 207a is diffracted and some of the diffracted beams pass through the glass block 207 and are subsequently detected by the detector photodiode chip 205. In this way, by controlling the intensity of the first laser beam to keep the intensity of the second laser beam at a predetermined value and also by projecting the second laser beam onto the optical disc so that the laser beam reflected from the optical disc can be detected by the detector photodiode chip 205, a signal indicative of information recorded on the optical disc can be obtained. In this way, the semiconductor laser device of a plastics package type having a signal detecting capability is realized.

As hereinabove described, in the twenty-fifth embodiment of the present invention, since the semiconductor laser chip 203 is covered by the transparent resin layer 211 made of silicone to hermetically seal the semiconductor laser chip 203, a condition of the beam emitting end face of the semiconductor laser chip 203 will not change under the influence of humidity, thereby avoiding any possibility of deterioration of the semiconductor laser chip 203. Accordingly, the need to use the expensive inert gas and the expensive metal cap such as required in the prior art devices is advantageously eliminated and, therefore, no complicated assemblage including the filling of the inert gas and fitting of a windowpane to the metal cap is required. In view of this, the semiconductor laser device inexpensive as compared with the prior art devices and having an increased environmental stability can be realized.

Also, since the transparent resin layer 211 made of silicone and covering the semiconductor laser chip 203 has a heat resistance, there is no possibility that the transparent resin layer 211 may be colored and/or deformed under the influence of heat evolved by the semiconductor laser chip 203 and the ambient temperature.

Figure 42:
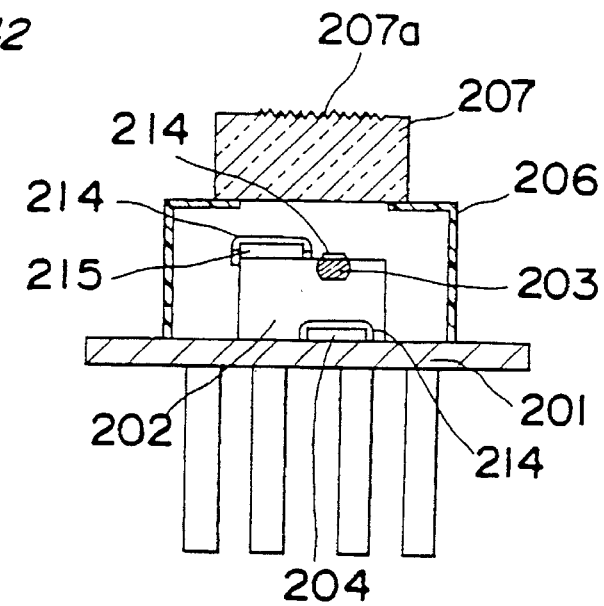
FIG. 42 is a view similar to FIG. 41, showing the semiconductor laser device according to a twenty-sixth embodiment of the present invention.
Figure 43:
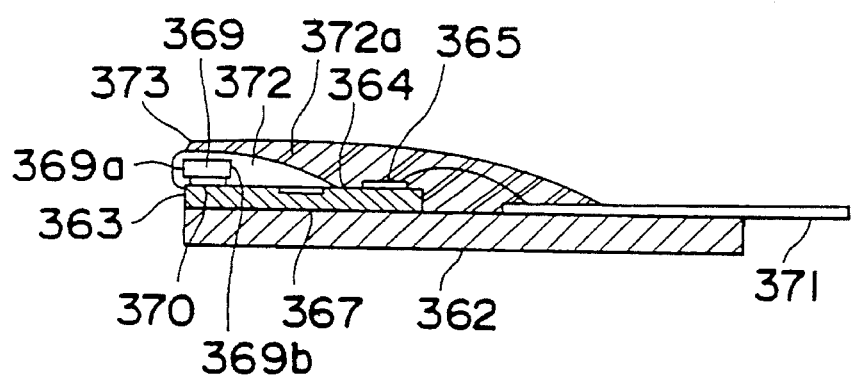
FIG. 43 is a longitudinal sectional view of one of the prior art semiconductor laser devices.
Figure 44:
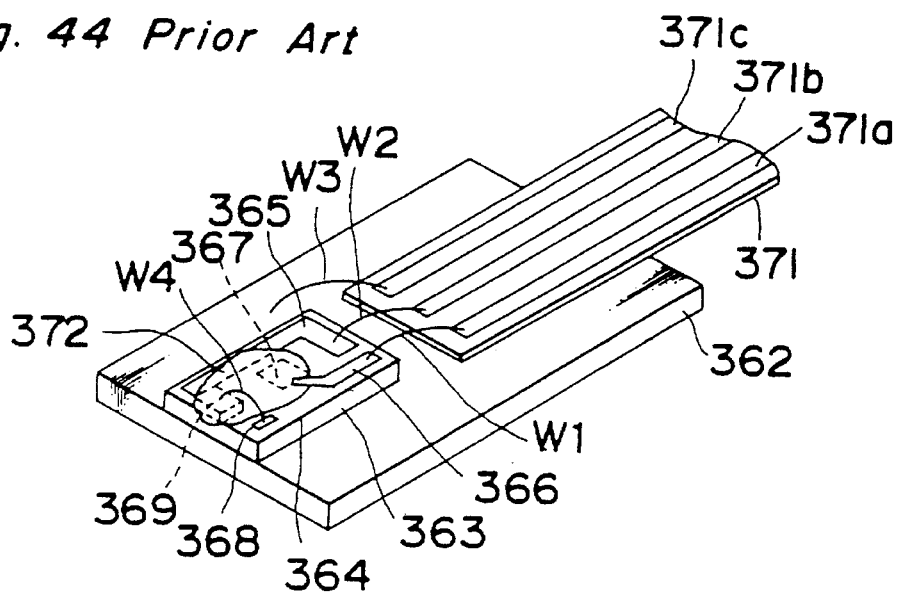
FIG. 44 is a perspective view of the prior art semiconductor laser device shown in FIG. 43.
Figure 45:
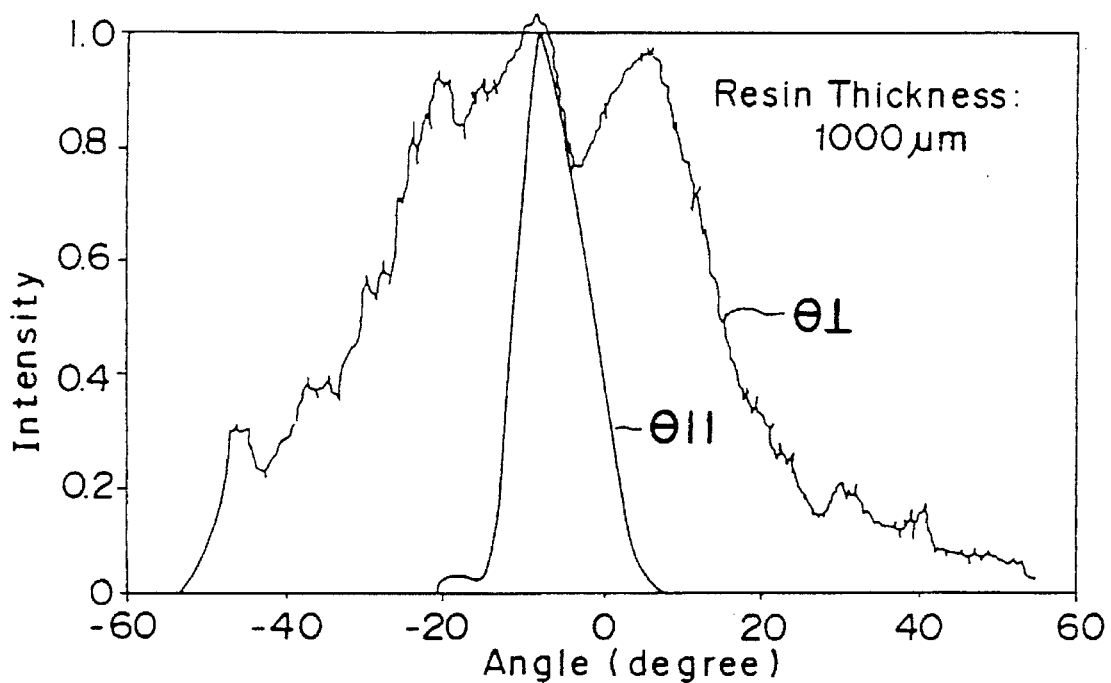
FIG. 45 is a graph showing the laser emission characteristic of the prior art semiconductor laser device wherein a portion of the resin layer confronting a front beam emitting end face of a semiconductor laser chip has a thickness of 1,000 μm.
Figure 46:
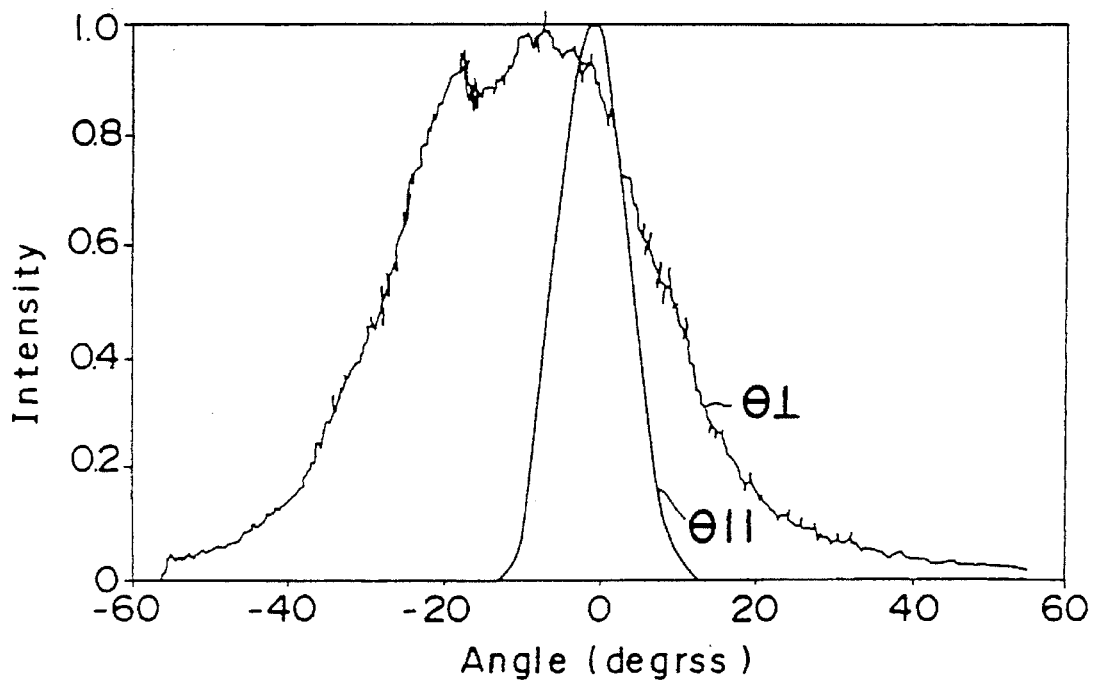
FIG. 46 is a graph showing the laser emission characteristic of the prior art semiconductor laser device wherein a coating of resin covering the front beam emitting end face of the semiconductor laser chip does not lie parallel to the front beam emitting end face.
Figure 47:
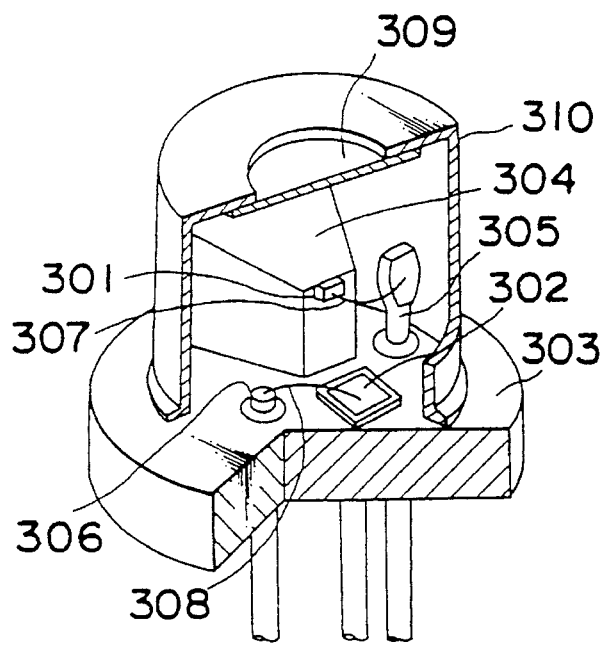
FIG. 47 is a perspective view, with a portion cut away, of another one of the prior art semiconductor laser devices.
Figure 50:
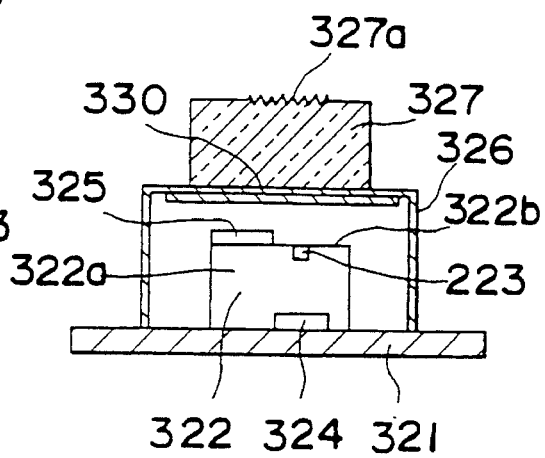
FIG. 50 is a longitudinal sectional view of a still further one of the prior art semiconductor laser device.
Figure 48:
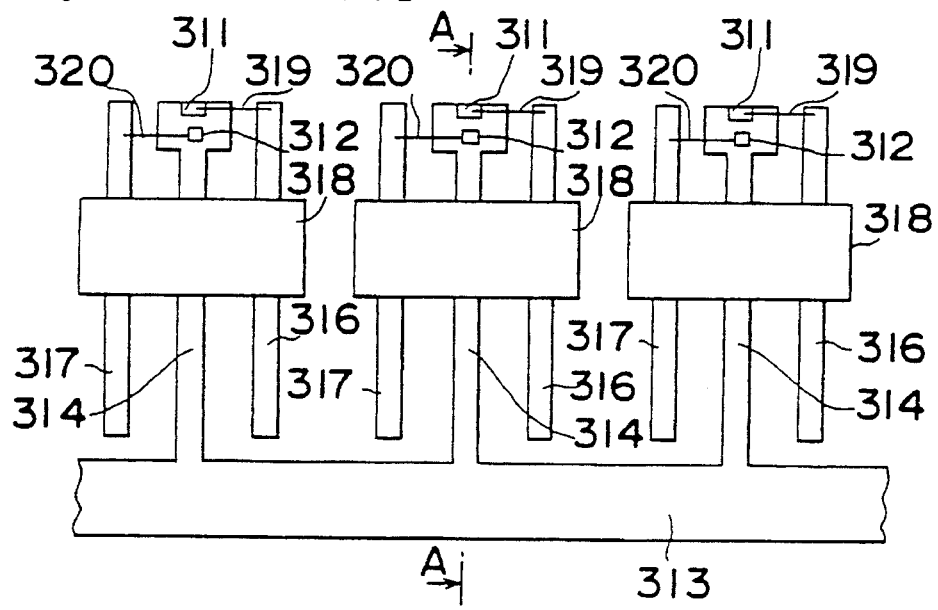
FIG. 48 is a plan view of the lead frame used to manufacture a further one of the prior art semiconductor laser devices.
Figure 49:
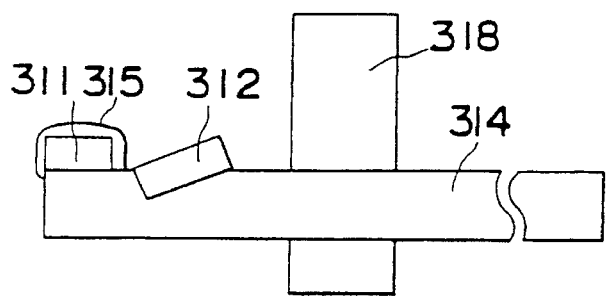
FIG. 49 is a cross-sectional view taken along the line A—A in FIG. 48.

FIG. 42 illustrates a twenty-sixth preferred embodiment of the present invention. In view of the similarity between the twenty-fifth and twenty-sixth embodiments of the present invention, parts shown in FIG. 41, but similar to those shown in FIG. 42 are designated by like reference numerals used in FIG. 41.

In the embodiment shown in FIG. 42, different transparent resin layers generally identified by 214 and both made of silicone resin are employed to cover the semiconductor laser chip 203, the monitor photodiode chip 204 and the detector photodiode chip 205, respectively. It is however pointed out that not only the surface areas of the transparent resin layer 214 covering the semiconductor laser chip 203, which confronts the monitor photodiode chip 204 and faces in a direction opposite to the monitor photodiode chip 204, respectively, are rendered to be parallel to each other while, at the same time, those portions of the resin layer 214 on the semiconductor laser chip 203 which are aligned with the respective parallel surface areas have a thickness not greater than 500 µm. Accordingly, any possible deterioration in characteristic of each of the semiconductor laser chip 203, the monitor photodiode chip 204 and the detector photodiode chip 205 under the influence of external humidity can be avoided.

It is to be noted that, although in the embodiments shown in FIGS. 41 and 42, respectively, the plastics cap 206 has been employed, a metal or ceramics cap may be employed in place of the plastics cap.

it is also to be noted that, although in the embodiments shown in FIGS. 41 and 42, respectively, a combination of the stem base 201 and the stem 202 has been used to mount the semiconductor laser chip 203, this combination may be replaced with the lead frame or a printed circuit board. In such case, no job of fitting the leads to the stem base and of fixing the stem is required and, hence, the productivity can be increased.

As hereinabove described, even in the twenty-sixth embodiment of the present invention, since the semiconductor laser chip 203 is covered by the transparent resin layer 214 made of silicone to hermetically seal the semiconductor laser chip 203, a condition of the beam emitting end face of the semiconductor laser chip 203 will not change under the influence of humidity, thereby avoiding any possibility of deterioration of the semiconductor laser chip 203. Accordingly, the need to use the expensive inert gas and the expensive metal cap such as required in the prior art devices is advantageously eliminated and, therefore, no complicated assemblage including the filling of the inert gas and fitting of a windowpane to the metal cap is required. In view of this, the semiconductor laser device inexpensive as compared with the prior art devices and having an increased environmental stability can be realized.

Although the present invention has been described in connection with the preferred embodiments thereof with reference to the accompanying drawings, it is to be noted that various changes and modifications are apparent to those skilled in the art. By way of example, while the transparent resin used in the practice of the present invention has been described as made of silicone resin, any one of epoxy resin, polyimide resin, fluorine resin or UV-curable resin may be employed therefor.

Such changes and modifications are to be understood as included within the scope of the present invention as defined by the appended claims, unless they depart therefrom.

What is claimed is:

1. A semiconductor laser device including a base, a semiconductor laser chip and a resin layer enclosing the laser chip, said resin layer being made of a single synthetic resin and covering an outwardly oriented beam emitting end face of the laser chip, said resin layer having a thickness not greater than 500 µm and not less than 10 µm and having a surface substantially parallel to the outwardly oriented beam emitting end face of the laser chip.

2. The semiconductor laser device as claimed in claim 1, wherein said base is a stem, and further comprising a monitor photodiode chip mounted on the stem at a position inwardly of the laser chip.

3. The semiconductor laser device as claimed in claim 1, wherein said base is a lead frame and said laser chip is mounted on one of leads of the lead frame through a sub-mount, and further comprising a monitor photodiode mounted on said one of the leads at a position inwardly of the laser chip, a direction in which a light receiving surface of the monitor photodiode extends being substantially perpendicular to an inwardly oriented beam emitting end face of the laser chip.

4. The semiconductor laser device as claimed in claim 1, wherein said base is a lead frame, a portion of one of leads of the lead frame which is positioned inwardly of the laser chip is inclined so as to confront an inwardly oriented beam emitting end face of the laser chip, and further comprising a monitor photodiode mounted in said inclined portion of said one of the leads of the lead frame.

5. The semiconductor laser device as claimed in claim 1, wherein said base is a lead frame, a portion of one of leads of the lead frame which is positioned inwardly of the laser chip being inwardly recessed, and further comprising a monitor photodiode mounted in said recessed portion in said one of the leads of the lead frame, a direction in which a light receiving surface of the monitor photodiode extends being substantially perpendicular to an inwardly oriented beam emitting end face of the laser chip.

6. A semiconductor laser device including a base, a semiconductor laser chip and a resin layer enclosing the laser chip, a monitor photodiode, said base having a mount face upon which the laser chip is directly mounted and where the laser chip is mounted at a level higher than that of a light receiving surface of the monitor photodiode for receiving a laser beam emitted from a rear face of the laser diode chip, both of said laser diode chip and monitor photodiode being mounted on said base so that said light receiving surface and a direction of emission of the laser beam from a rear beam emitting end face of the laser diode chip lie substantially perpendicular to each other.

7. The semiconductor laser device as claimed in claim 6, wherein a reference index is provided on the base for die-bonding the laser diode chip at a predetermined position.

8. The semiconductor laser device as claimed in claim 6 or claim 7, wherein the resin layer enclosing the laser diode chip has a resin thickness not smaller than 10 µm.

9. A semiconductor laser device comprising a base; a semiconductor laser chip mounted on the base; a resin layer enclosing the laser chip; a monitor photodiode chip mounted on the base and adapted to receive a laser beam emitted from the laser chip; a first wire for electrically connecting the laser chip with a first conductor; and a second wire for electrically connecting the photodiode chip with a second conductor; and a protective member, said protective member being distinct from said resin layer and integrally fitted to the base so as to enclose at least the laser chip, the photodiode chip and both of the first and second wires to thereby protect them from external forces.

10. The semiconductor laser device as claimed in claim 9, wherein said base is one of leads of a lead frame and said protective member is a generally cylindrical casing closed at one end by an end wall, said leads of the lead frame extending through the end wall of the casing.

11. The semiconductor laser device as claimed in claim 9, wherein said base, said first conductor and said second conductor are constituted by the leads of the lead frame, respectively, and wherein said protective member is a generally cylindrical casing closed at one end by an end wall and having an inner peripheral surface formed with at least two grooves extending axially thereof, said protective member being integrally fitted to the leads with outermost two of the leads being received within the respective grooves.

12. The semiconductor laser device as claimed in any one of claims 9 to 11, wherein said protective member is of a closed structure having an aperture defined therein for passage therethrough of a laser beam emitted from the laser chip so as to travel outwardly of the protective member, said protective member having an interior surface coated with a light absorbing layer.

13. The semiconductor laser device as claimed in any one of claims 9 to 12, wherein said protective member includes an optical member positioned on a path of travel of a laser beam emitted from the laser chip so as to travel outwardly of the protective member.

14. The semiconductor laser device as claimed in any one of claims 9 to 13, wherein said protective member has a reference face defined therein for determination of a reference position for mounting said device in external equipment.

* * * * *

UNITED STATES PATENT AND TRADEMARK OFFICE

CERTIFICATE OF CORRECTION

PATENT NO. : 5,557,116

DATED : September 17, 1996

INVENTOR(S) : Katsushige Masui, Nobuyuki Miyauchi, Zenpei Tani, Hiroshi Chikugawa, Makoto Tsuji, Masaru Ogawa, and Takehiro Shiomoto It is certified that error appears in the above-identified patent and that said Letters Patent is hereby corrected as shown below:

In column 1, line 24, please change "," to --.--.

In column 1, line 54, please change "sub-mound" to --sub-mount--.

In column 1, line 54, please change "an" to --a--.

In column 2, line 2, please change "rein" to --resin--.

In column 2, line 9, please change "forme" to --form--.

In column 2, line 26, please change "cannot be satisfactorily" to --cannot satisfactorily--.

In column 3, line 37, please change "side" to --sides--.

In column 3, line 55, please change "device" to --devices--.

In column 3, line 62, please change "an" to --the--.

In column 4, line 15, please change "pass" to --passes--.

In column 4, line 41, please change "can be effec-" to -- can effec- --.

In column 4, line 59, please change "including" to --includes--.

In column 5, line 9, please change "lie" to --lies--.

UNITED STATES PATENT AND TRADEMARK OFFICE
CERTIFICATE OF CORRECTION

PATENT NO. : 5,557,116
DATED : September 17, 1996
INVENTOR(S) : Masui et al.

It is certified that error appears in the above-indentified patent and that said Letters Patent is hereby corrected as shown below:

In column 5, line 36, please change "of leads" to --of the leads--.

In column 5, line 38, please change "comprises" to --comprise--.

In column 5, line 39, after "mounted on" please delete --the--.

In column 5, line 48, please change "exhibits" to --exhibit--.

In column 5, line 61, please change "one of leads" to --one of the leads--.

In column 5, line 65, after "inclined portion of" please delete --the--.

In column 6, line 4, please change "has" to --having--.

In column 6, line 6, please change "exhibits" to --exhibit--.

In column 6, line 7, please change "," to --.--.

In column 6, line 15, please change "impinge" to --impinges--.

In column 6, line 17, please change "one of leads" to --one of the leads--.

In column 6, line 20, after "portion in" please delete --the--.

In column 6, line 35, please change "has" to --having--.

In column 6, line 37, please change "exhibits" to --exhibit--.

In column 6, line 38, please change "," to --.--.

In column 6, line 57, please change "," to --.--.

UNITED STATES PATENT AND TRADEMARK OFFICE
CERTIFICATE OF CORRECTION

PATENT NO. : 5,557,116
DATED : September 17, 1996
INVENTOR(S) : Masui et al.

It is certified that error appears in the above-indentified patent and that said Letters Patent is hereby corrected as shown below:

In column 7, line 3, please change "can effectively" to --can be effectively--.

In column 7, line 27, please change "one of leads" to --one of the leads--.

In column 7, line 59, please change "may of" to --may be of--.

In column 9, line 59, please change "as" to --is--.

In column 9, line 62, please change "as" to --is--.

In column 11, line 4, please change "device" to --devices--.

In column 11, line 45, please change "lie" to --lies--.

In column 11, line 48, please change "illustrates" to --illustrate--.

In column 13, line 22, please change "illustrate" to --illustrates--.

In column 14, line 23, please change "extend" to --extends--.

In column 15, line 9, please change "know" to --known--.

In column 15, line 20, please change "an" to --a--.

In column 16, line 20, please change "chips" to --chip--.

In column 16, line 25, please change "layer not shown)." to -- layer (not shown).--.

In column 16, line 44, please change "extends" to --extend--.

UNITED STATES PATENT AND TRADEMARK OFFICE
CERTIFICATE OF CORRECTION

PATENT NO. : 5,557,116
DATED : September 17, 1996
INVENTOR(S) : Masui et al.

It is certified that error appears in the above-indentified patent and that said Letters Patent is hereby corrected as shown below:

In column 17, line 27, please change "assembly" to --assemble--.

In column 18, line 12, please change "protecting" to --protective--.

In column 18, line 19, please change "are filled" to --is filled--.

In column 18, line 21, please change "178" to --138--.

In column 19, line 56, please change "is" to --are--.

In column 19, line 57, please change "amounting" to --mounting--.

In column 20, line 15, please change "157 connected" to --157 are connected--.

In column 20, line 58, after "satisfactorily", please delete --be--.

In column 22, line 43, please change "nd/or" to --and/or--.

In column 22, line 56, please change "ripple" to --ripples--.

In column 23, line 28, please change "sub-mound" to --sub-mount--.

In column 24, line 37, please change "illustrate" to --illustrates--.

In column 25, line 21, please change "one of leads" to --one of the leads--.

In column 25, line 50, please change "to a yet aspect" to --to yet another aspect--.]

In column 25, line 57, please change "but portion" to --but the portion--.

In column 26, line 8, please change "in a different equipments" to --in different equipment--.

UNITED STATES PATENT AND TRADEMARK OFFICE
CERTIFICATE OF CORRECTION

PATENT NO. : 5,557,116
DATED : September 17, 1996
INVENTOR(S) : Masui et al.

It is certified that error appears in the above-indentified patent and that said Letters Patent is hereby corrected as shown below:

In column 26, line 35, please change "fails" to --fail--.

In column 26, line 45, please change "can no longer useable" to --can no longer be useable--.

In column 26, line 59, please change "exhibits" to --exhibit--.

In column 27, line 27, please change "beams" to --beam--.

In column 27, line 40, please change "206 passes" to --206, passes--.

In column 28, line 40, please change "it" to --It--.

In column 29, line 24, please change "one of leads" to --one of the leads--.

In column 29, line 32, please change "one of leads" to --one of the leads--.

In column 29, line 40, please change "one of leads" to --one of the leads--.

In column 29, line 48, please change "chip and a" to --chip, a--.

UNITED STATES PATENT AND TRADEMARK OFFICE
CERTIFICATE OF CORRECTION

PATENT NO.  : 5,557,116
DATED       : September 17, 1996
INVENTOR(S) : Masui et al.

It is certified that error appears in the above-indentified patent and that said Letters Patent is hereby corrected as shown below:

In column 29, line 49, please change "chip, a" to --chip, and a--.

In column 30, line 24, please change "one of leads" to --one of the leads--.

In column 30, line 35, please change "with outermost" to --with the outermost--.

Signed and Sealed this

Fifteenth Day of April, 1997

Attest:

BRUCE LEHMAN

Attesting Officer

Commissioner of Patents and Trademarks